(12) United States Patent
Minami et al.

(10) Patent No.: US 9,903,981 B2
(45) Date of Patent: Feb. 27, 2018

(54) LAMINATED BODY

(71) Applicant: DAIDO STEEL CO., LTD., Nagoya-shi, Aichi (JP)

(72) Inventors: Kazuki Minami, Aichi (JP); Yuichiro Tago, Aichi (JP); Kazuya Sakaguchi, Aichi (JP)

(73) Assignee: DAIDO STEEL CO., LTD., Aichi (JP)

( * ) Notice: Subject to any disclaimer, the term of this patent is extended or adjusted under 35 U.S.C. 154(b) by 210 days.

(21) Appl. No.: 14/920,919

(22) Filed: Oct. 23, 2015

(65) Prior Publication Data

US 2016/0116641 A1    Apr. 28, 2016

(30) Foreign Application Priority Data

Oct. 24, 2014  (JP) ................. 2014-217771

(51) Int. Cl.
| | | |
|---|---|---|
| *G02B 1/116* | (2015.01) | |
| *C23C 14/08* | (2006.01) | |
| *C23C 14/06* | (2006.01) | |
| *G06F 3/041* | (2006.01) | |
| *C23C 14/00* | (2006.01) | |
| *C23C 14/18* | (2006.01) | |
| *C23C 28/00* | (2006.01) | |

(52) U.S. Cl.
CPC .......... *G02B 1/116* (2013.01); *C23C 14/0036* (2013.01); *C23C 14/0641* (2013.01); *C23C 14/08* (2013.01); *C23C 14/087* (2013.01); *C23C 14/185* (2013.01); *C23C 28/321* (2013.01); *C23C 28/34* (2013.01); *C23C 28/345* (2013.01); *G06F 3/041* (2013.01); *G06F 2203/04103* (2013.01)

(58) Field of Classification Search
CPC ....................................................... G02B 1/116
USPC ....................................................... 428/469
See application file for complete search history.

(56) References Cited

U.S. PATENT DOCUMENTS

2015/0293560 A1* 10/2015 Choi .................... G06F 3/0412
                                                                     345/174

FOREIGN PATENT DOCUMENTS

| JP | 2013-169712 | 9/2013 |
|---|---|---|
| JP | 2013-235315 | 11/2013 |

* cited by examiner

*Primary Examiner* — Terressa Boykin
(74) *Attorney, Agent, or Firm* — Greenblum & Bernstein, P.L.C.

(57) ABSTRACT

The present invention relates to a laminated body containing at least (a) a transparent substrate, (b) a first metal layer that is overlaid on the substrate and forms an electrode, and (c) a second metal layer having a light reflectance of 20% or less, in which the second metal layer is overlaid on the surface of the first metal layer opposite to the substrate or between the first metal layer and the substrate by sputtering using a reactive sputtering gas, and the second metal layer is constituted by an oxide or nitride of a Cu alloy containing at least Zn.

10 Claims, 7 Drawing Sheets

(I)

(II)

(III)

(IV)

(V)

(VI)

(I)

(II)

(III)

(IV)

(V)

(VI)

(I)

(II)

(III)

(IV)

(V)

(VI)

(VII)

LAMINATED BODY

FIELD OF THE INVENTION

The present invention relates to a laminated body containing a transparent substrate and a metal layer laminated thereto to form an electrode. More specifically, the present invention relates to a laminated body suitably usable as a sensor for touch operation detection in a touch panel (touch panel sensor).

BACKGROUND ART OF THE INVENTION

A touch panel is a device in which a sensor for touch operation detection (touch panel sensor) is overlaid on the upper surface of a display device (displaying device) such as a liquid crystal panel and in which two functions of display and input are united. In the touch panel, when an operator performs a touch operation to a display on the screen, information of the operated position is output outside as a signal and an external device conducts a suitable action desired by the operator based on the information of the operated position.

Owing to such advantages that it is easy to handle because its operation is intuitively easy to understand and that it is capable of being miniaturized because an input device and a display device can be integrated without any keyboard, a tough panel has been widely used for ATM in banks, ticket vending machines in stations, information terminals in libraries, copying machines, car navigation systems, mobile phones, personal digital assistants, portable game machines, facsimile machines, and the like.

There are various detection types for the touch operation in a touch panel. For example, there are a resistive film type, an electrostatic capacitance type, and the like and the electrostatic capacitance type also includes a surface electrostatic capacitance type, a projection electrostatic capacitance type, and the like. Among these, the projection electrostatic capacitance type with which multi-touch and a gesture operation are possible has been widely used for mobile phones, tablet PC's, and the like.

In the projection electrostatic capacitance type touch panel sensor, when a user touches a screen, a change in electrostatic capacitance between an electrode and another electrode is detected to detect a touched position.

Here, the touch panel sensor has an electrode in an X-axis direction (hereinafter sometimes referred to as an X-side electrode) and an electrode in a Y-axis direction (hereinafter sometimes referred to as a Y-side electrode) and a position in the X direction is detected by the X-side electrode and a position in the Y direction that is orthogonal to the X direction is detected by the Y-side electrode. Then, a two-dimensional touch position is specified by the X-side electrode and the Y-side electrode.

In conventional touch panel sensors, a transparent ITO (Indium Tin Oxide) electrode is used as an electrode but the electrode has problems that it exhibits a high resistance value and is not suitable for a large-sized panel.

In the case of the ITO electrode, there is also a problem of high costs.

Accordingly, in recent years, attention is focused on a metal electrode that is formed by arranging extra-fine metal lines in a grid pattern. This metal electrode has such various advantages that it can be applied to a large-sized panel owing to its small resistance value and high sensitivity, that a life of a battery can be enhanced because its consumption of electric power is little, that it costs low, and the like.

However, on the other hand, in the case of the metal electrode using the metal lines, since the metal lines are not transparent and has metallic luster, there is a problem that light from the outside reflects by the metal lines and thus visibility for the display part is decreased by the reflected light.

Conventionally, the following have been considered and proposed as measures against the problem.

For example, Patent Document 1 discloses an invention of a "touch panel sensor" and also discloses that a metal electrode formed on a surface of a transparent substrate is constituted by a metal wiring part of cupper or the like and a low reflective layer containing fine particles of carbon black or the like and that the metal wiring part and the low reflective layer are formed by an inkjet method.

However, in the case where the low reflective layer is formed by an inkjet method, it is difficult to thin the line width and there is a concern that visibility for the display part may decrease when the line width becomes thick.

Moreover, there is no structure proposed in Patent Document 1 that is capable of reducing the reflection of the light from the outside of a viewing side even in the case where the laminated body composed by laminating the transparent substrate and the metal electrode is reversed upside down.

On the other hand, Patent Document 2 discloses an invention of a "laminated body" and discloses that a laminated body composed by laminating a conductive metal layer on a transparent substrate is constructed as a blackened layer, a metal layer, a substrate, a blackened layer, and a metal layer in this order from a viewing side, and that copper nitride in an already oxidized state is formed as the blackened layer by reactive sputtering.

However, as for the technique in which copper nitride is formed by reactive sputtering as a blackened layer as described in Patent Document 2, the effect of reducing reflectance by the blackened layer is not necessarily satisfactory and there is a concern that visibility may decrease.

Patent Document 2 discloses two cases where the blackened layer is provided on the surface opposite to the substrate, of the metal layer that forms an electrode and where the blackened layer is provided between the substrate and the metal layer. However, in both cases, reflection in specific one direction is only prevented and the laminated body does not have a structure that is capable of reducing the reflection of the light from the outside of a viewing side also in the case where the laminated body is reversed upside down.

Patent Document 1: JP-A-2013-235315
Patent Document 2: JP-A-2013-169712

SUMMARY OF THE INVENTION

In consideration of the above circumstances as a background, the present invention is made for the purpose of providing an easily producible and inexpensive laminated body which has a transparent substrate and a metal layer that is laminated on the substrate and forms an electrode, can effectively reduce the reflection of light from the outside while using a metal for the electrode, and can secure high visibility for the display part in the case of configuring a touch panel sensor.

In order to attain the above-mentioned purpose, the present invention provides a laminated body containing at least:
(a) a transparent substrate,
(b) a first metal layer that is overlaid on the substrate and forms an electrode, and
(c) a second metal layer having a light reflectance of 20% or less, in which the second metal layer is overlaid on the surface of the first metal layer opposite to the substrate or between the first metal layer and the substrate by sputtering using a reactive sputtering gas, in which the second metal layer is constituted by an oxide or nitride of a Cu alloy containing at least Zn.

It is preferable that the second metal layer is overlaid both on the surface of the first metal layer opposite to the substrate and between the first metal layer and the substrate so as to sandwich the first metal layer without interposing the substrate.

It is preferable that the first metal layer is constituted by a Cu alloy, and the Cu alloy has a composition containing Zn and at least one element selected from the group consisting of B, Mg, Al, Ca, Ti, and Cr, with the balance being Cu and inevitable impurities.

It is preferable that the Cu alloy constituting the first metal layer has a composition containing Zn in a content of from 0.1 at % to 10 at % and containing at least one element selected from the group consisting of B, Mg, Al, Ca, Ti, and Cr in a total content of from 0.1 at % to 6 at %, with the balance being Cu and inevitable impurities.

The first metal layer preferably has an electric resistivity of 8.0 μΩ·cm or less.

It is preferable that the first metal layer is in close contact with the transparent substrate or/and the second metal layer, and a degree of adhesion therebetween is classified as a classification 0 to 3 as defined in JIS K5600-5-6:1999.

It is preferable that the second metal layer is formed by sputtering using a target material, and the target material is composed of a Cu alloy having a composition containing Zn with the balance being Cu and inevitable impurities, or a Cu alloy having a composition containing Zn and at least one element selected from the group consisting of Al, Ti, Sn, and Ni, with the balance being Cu and inevitable impurities.

It is preferable that the second metal layer has a composition containing Zn in a content of from 0.1 at % to less than 25 at %, with the balance being Cu, and O or N, and inevitable impurities.

It is preferable that the second metal layer has a composition containing Zn in a content of from 0.1 at % to less than 25 at % and at least one element selected from the group consisting of Al, Ti, Sn, and Ni in a total content of from 0.1 at % to less than 15 at %, with the balance being Cu, and O or N, and inevitable impurities.

It is preferable that the second metal layer is in close contact with the transparent substrate or/and the first metal layer, and a degree of adhesion therebetween is classified as a classification 0 to 3 as defined in JIS K5600-5-6:1999.

In the present invention, at the constitution of a laminated body containing a transparent substrate and a first metal layer which forms an electrode, a second metal layer to be a dark color layer having a light reflectance of 20% or less is formed by sputtering using a reactive sputtering gas. The second metal layer is overlaid, on the surface of the first metal layer opposite to the substrate, i.e., on the upper surface of the first metal layer when the substrate is made downward and the first metal layer is made upward; or between the first metal layer and the substrate.

In the case where the second metal layer having a light reflectance of 20% or less is overlaid on the upper surface of the first metal layer according to the present invention, the reflection light of the light entering from the first metal layer side toward the substrate side, from the first metal layer can be kept low.

Therefore, in the case where the laminated body is applied to a touch panel sensor, the deterioration of visibility for the display part due to the metal electrode can be substantially prevented and it becomes possible to secure good visibility.

On the other hand, in the case where the second metal layer having a light reflectance of 20% or less is overlaid between the first metal layer and the substrate, when the laminated body is placed so that the substrate side is made upward and the first metal layer side is made downward, and when the light from the outside enters from the substrate side toward the first metal layer side, the reflection of the light by the first metal layer can be suppressed and it becomes possible to secure good visibility.

One of the characteristic features of the present invention is that the second metal layer to be a dark color layer is configured with an oxide or nitride of a Cu alloy containing at least Zn and formed by reactive sputtering.

Since a Cu alloy to which Zn is solely added or a Cu alloy to which a plurality of elements including Zn are added can attain an effect of reducing reflectance due to oxidation or nitridation of the added element, these Cu alloys can further reduce the reflectance as compared with, for example, a product of oxidization or nitridation of Cu simple substance.

Moreover, at the application of the laminated body to a touch panel sensor, the film formed by sputtering can be removed at the time of removing an excessive part of the film to form sufficiently fine lines, so that there can be solved the problem of visibility decrease caused by thickening of the metal lines constituting the electrodes.

In the present invention, the second metal layer can be overlaid both on the surface of the first metal layer opposite to the substrate and between the first metal layer and the substrate so as to sandwich the first metal layer without interposing the substrate, by the reactive sputtering.

When the laminated body has such a laminate structure, even in the case where the laminated body is disposed so that the first metal layer is made upward and the substrate is made downward or, in reverse, even in the case where the laminated body is disposed so that the substrate is made upward and the first metal layer is made downward at the constitution of a touch panel sensor by using the laminated body, light can be satisfactorily absorbed for the incidence of the light from the outside from the upper side to the lower side to thereby suppress the reflection low. Thus, it is possible to secure high visibility while substantially preventing the first metal layer that forms an electrode from impairing the visibility for the display part.

According to the present invention as described above, it is possible to provide an easily producible and inexpensive laminated body which can effectively reduce the reflection of light from the outside while using a metal for an electrode and can secure high visibility for a display part in the case of configuring a touch panel sensor.

DETAILED DESCRIPTION OF THE INVENTION

The following will describe embodiments of the present invention in detail.

Figure 1A:
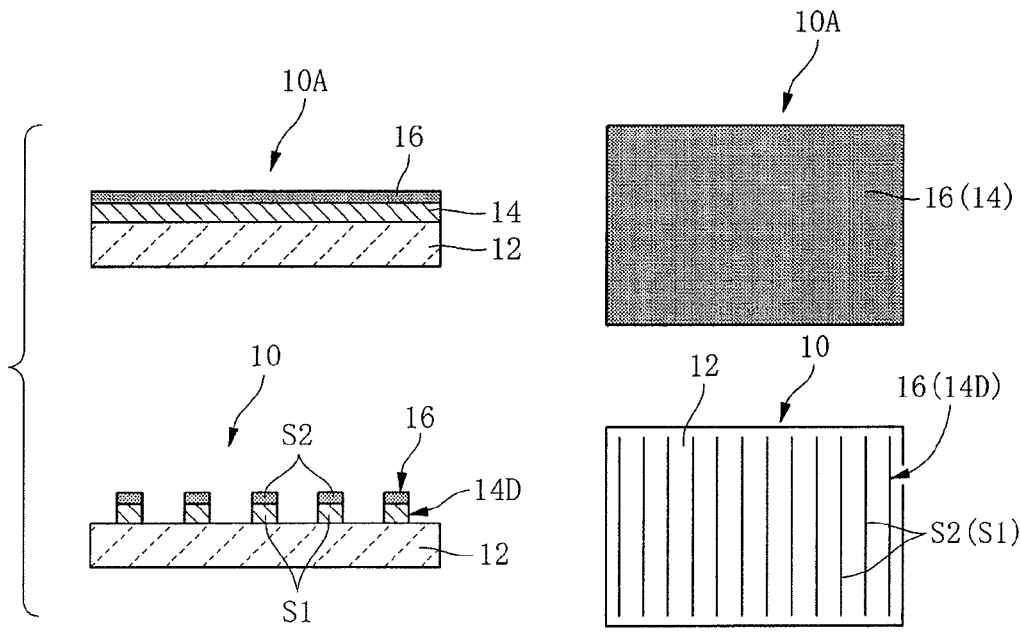
FIG. 1A is a view illustrating a laminated body of an embodiment of the present invention.

In FIG. 1A, the numeral 10A indicates one example of the laminated body of the present invention.

In the drawings, 12 is a transparent substrate and on one surface (upper surface in the drawing) of the substrate 12 is overlaid a first metal layer 14 that forms an electrode in a film form over the whole surface of the substrate 12. Further, on the surface opposite to the substrate 12, i.e., the upper surface, in the drawing, of the first metal layer 14 is overlaid a second metal layer 16 to be a dark color layer by lamination.

The second metal layer 16 is also formed in a film form over the whole surface of the first metal layer 14.

The transparent substrate 12 may be formed of glass such as soda lime glass and also may be formed of a resin material such as polyethylene terephthalate (PET), polypropylene (PP), polystyrene (PS), polyvinyl chloride (PVC), polycarbonate (PC), polymethyl methacrylate (PMMA), or polyimide (PI). As the resin material, polyethylene terephthalate (PET) is preferred.

The thickness of the substrate 12 is desirably within the range of from 10 μm to 10 mm and more preferably from 100 μm to 1 mm.

The first metal layer 14 preferably has such high conductivity that electric resistivity is 8.0 μΩ·cm or less, and as a material for achieving such high conductivity, use can be made of a Cu alloy. Moreover, as the Cu alloy, preferable is a Cu alloy having a composition containing Zn and at least one element selected from the group consisting of B, Mg, Al, Ca, Ti, and Cr, with the balance being Cu and inevitable impurities. The lower limit of the electric resistivity is not particularly limited, but may be 1.7 μΩ·cm or more.

When the Cu alloy containing an element selected from the group consisting of B, Mg, Al, Ca, Ti, and Cr (hereinafter sometimes referred to as "M element") together with Zn is subjected to a thermal treatment at a predetermined temperature (at from 50° C. to 320° C., preferably at from 100° C. to 200° C.), the M element is thickened in the periphery of the interface of the substrate and also Zn, which is difficult to thicken alone, is thickened in the periphery of the interface. Since Zn having high affinity with oxygen is thickened in the interface, the degree of adhesion between the Cu alloy and the transparent substrate 12 increases. This effect is particularly remarkable when a polyethylene terephthalate (PET) resin is used as the substrate 12.

According to this embodiment, it is possible to omit an intervention of an extra adhesive layer between the substrate 12 and the first metal layer 14.

For enhancing the bonding properties sufficiently, the above Cu alloy is desirably formed as an alloy containing Zn in a content of from 0.1 at % to 10 at % and containing the M element, i.e., at least one element selected from the group consisting of B, Mg, Al, Ca, Ti, and Cr in a total content of from 0.1 at % to 6 at %.

For omitting the adhesive layer between the first metal layer 14 and the substrate 12 and between the first metal layer 14 and the second metal layer 16, the degree of adhesion between the first metal layer 14 and the substrate 12 or/and the second metal layer 16 is desirably classified as a classification 0 to 3 as defined in JIS K5600-5-6:1999.

With regard to thickness, the first metal layer 14 is desirably formed in a thickness of from 10 nm to 1 μm and more preferably from 50 nm to 500 nm.

The second metal layer 16 to be a dark color layer is overlaid on the upper surface, in the drawing, of the first metal layer 14 by reactive sputtering.

Since the second metal layer 16 is a layer for the purpose of eliminating the metal luster on the upper surface of the first metal layer 14 to darken it, light reflectance of the second metal layer is suppressed to 20% or less.

In the present embodiment, the second metal layer 16 is formed of an oxide or nitride of a Cu alloy containing at least Zn by using reactive sputtering.

Here, the reason why the reflectance is controlled to 20% or less is that, as the reflectance of 20% being a border, light reflection by the extra-fine metal lines to be mentioned later can be hardly felt and good visibility for the display part of a touch panel can be secured when the reflectance is 20% or less.

The second metal layer 16 as a dark color layer desirably has a light reflectance of 15% or less.

As a target material for forming the second metal layer 16, use can be made of various metals as long as they are metals having darkening ability. However, for having the darkening function and enhancing the bonding properties with the first metal layer 14 or/and with the substrate 12 (cases of FIG. 1B and the like to be mentioned later), it is desired to use a Cu alloy containing Zn as a target material.

The thickness of the second metal layer 16 is desirably in the range of from 5 nm to 1 μm and more preferably from 10 nm to 500 nm.

In this case, the second metal layer can be formed by sputtering using a target material of a Cu alloy having a composition containing Zn with the balance being Cu and inevitable impurities, or a Cu alloy having a composition containing Zn and at least one element selected from the group consisting of Al, Ti, Sn, and Ni, with the balance being Cu and inevitable impurities.

In the case where the Cu alloy of the target material has a composition containing Zn with the balance being Cu and inevitable impurities, it is preferable that the obtained second metal layer has a composition containing Zn in a content of from 0.1 at % to less than 25 at %, with the balance being Cu, and O or N, and inevitable impurities.

In the case where the Cu alloy of the target material has a composition containing Zn and at least one element selected from the group consisting of Al, Ti, Sn, and Ni, with the balance being Cu and inevitable impurities, it is preferable that the obtained second metal layer has a composition containing Zn in a content of from 0.1 at % to less than 25 at % and at least one element selected from the group consisting of Al, Ti, Sn, and Ni in a total content of from 0.1 at % to less than 15 at %, with the balance being Cu, and O or N, and inevitable impurities.

The degree of adhesion between the second metal layer 16 and the transparent substrate 12 or/and the first metal layer 14 is desirably classified as a classification 0 to 3 as defined in JIS K5600-5-6:1999.

The laminated body 10A is used as an element for a touch panel sensor actually through processing it. The numeral 10 indicates a laminated body after the processing.

In the laminated body 10 after processing, an excessive portion of the film-form first metal layer 14 in the laminated body 10A before processing is removed and a large number of extra-fine lines S1 alone remain as the first metal layer 14. The remaining extra-fine lines S1 are paralleled one another to form stripe-shaped pattern electrodes 14D.

Also with regard to the second metal layer 16, an excessive portion is removed and only the portion covering the upper surface, in the drawing, of the extra-fine lines S1 is allowed to remain as extra-fine lines S2. They have a function of absorbing light entering into the upper surface, in the drawing, of the extra-fine lines S1 to suppress the reflection of the light from the extra-fine lines S1.

Both of the laminated bodies 10A and 10 in FIG. 1A in this embodiment are included in the concept of the laminated body of the present invention. The same shall apply to the laminated bodies 20A and 20 in FIG. 1B, laminated bodies 22A and 22 in FIG. 2A, and laminated bodies 24A and 24 in FIG. 2B, which are to be described later.

In the laminated body 10, most of the light entering from the outside from the second metal layer 16 side toward the substrate 12 side are absorbed by the second metal layer 16 that is a dark color layer, specifically by the extra-fine lines S2, to thereby suppress the reflection from the first metal layer 14, i.e., the extra-fine lines S1 of the electrodes 14D.

Therefore, the visibility for an indication on a display device is substantially not impaired due to the reflection of the light from the electrodes 14D composed of a large number of extra-fine lines S1 and thus good visibility can be secured.

In the laminated body 10, the line width of the extra-fine lines S1 (also of the extra-fine lines S2) is desirably within the range of from 0.5 μm to 20 μm, more preferably from 1 μm to 10 μm and further preferably 1 μm to 5 μm.

Figure 3:
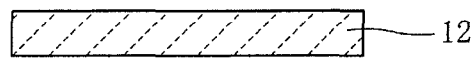
FIG. 3 is an explanatory view illustrating a production procedure of the laminated body 10 of FIG. 1A.
Figure 3:
Figure 3:
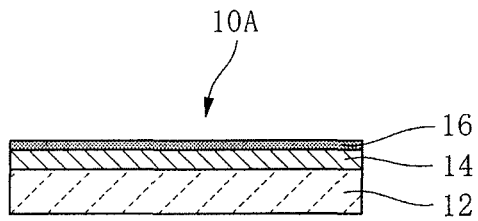
Figure 3:
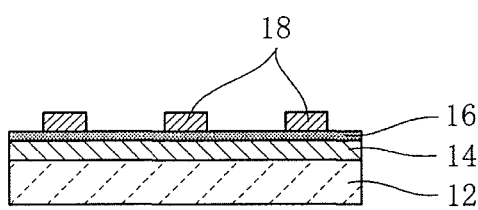
Figure 3:
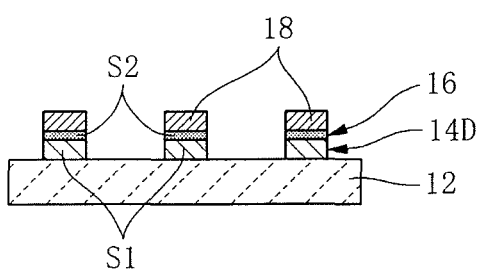
Figure 3:
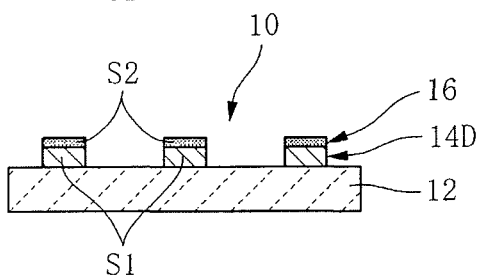

FIG. 3 illustrates a process example of a procedure for producing the laminated body 10 via the laminated body 10A.

As illustrated in the drawings, at the production of the laminated body 10, on the upper surface of the transparent substrate 12, the first metal layer 14 is first overlaid in a film form over the whole surface of the substrate 12 by non-reactive sputtering using a gas not reactive with a target material as a sputtering gas, as illustrated in (I) and (II) of FIG. 3.

Subsequently, as illustrated in (III) of FIG. 3, on the upper surface of the first metal layer 14, the second metal layer 16 is overlaid in a film form over the whole surface of the first metal layer 14 by reactive sputtering using $O_2$ or $N_2$ gas.

Thereafter, a photosensitive resist 18 is applied over the whole surface of the upper surface of the second metal layer 16 in a film form, light exposure is performed on the resist 18 only on non-removal portions of the second metal layer 16 and the first metal layer 14, to cure the resist 18 on the non-removal portions to remain, and the resist 18 on the other portions are removed, as illustrated in (IV) of FIG. 3.

Thereafter, as illustrated in (V) of FIG. 3, etching is performed to remove portions of the first metal layer 14 and the second metal layer 16, which are not masked with the resist 18. Finally, the resist 18 is removed, thereby obtaining the laminated body 10, as illustrated in (VI) of FIG. 3.

This is just an example of the production process. In this example, a so-called wet-etching method is used but it is also possible to use a dry-etching method instead.

Figure 1B:
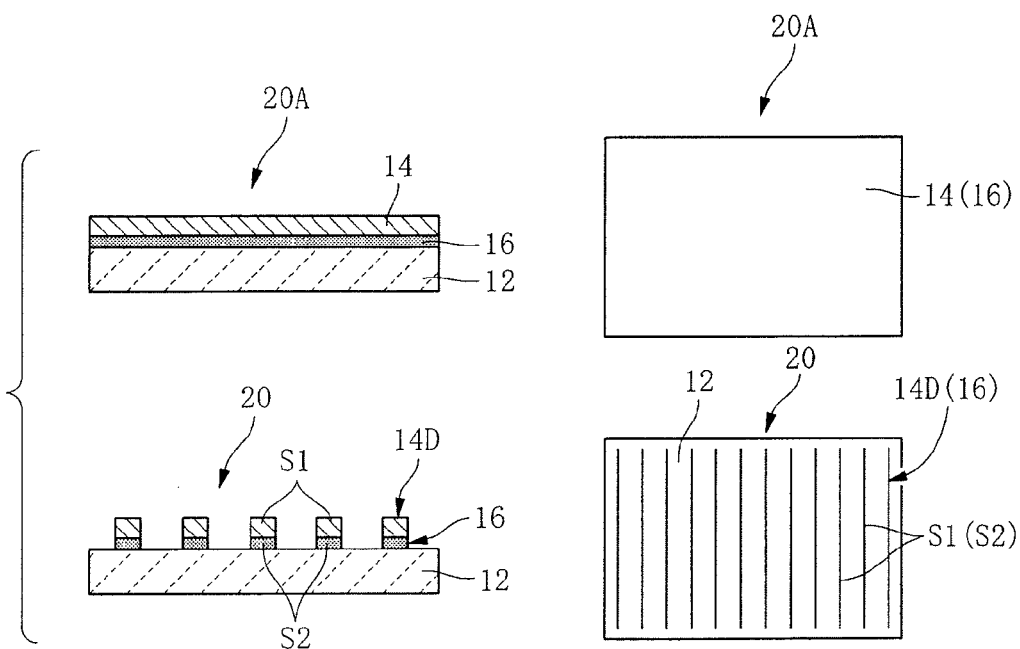
FIG. 1B is a view illustrating a laminated body of another embodiment of the present invention.

In FIG. 1B, the numeral 20A indicates an example of another embodiment of the laminated body in the present invention.

In the laminated body 20A, the second metal layer 16 is formed between the first metal layer 14 and the transparent substrate 12.

Also in the laminated body 20A, the first metal layer 14 and the second metal layer 16 are both formed in a film form by sputtering.

Of these, the second metal layer 16 is formed by reactive sputtering using $O_2$ or $N_2$ gas that reacts with the target material as a sputtering gas, as described in the above.

The numeral 20 is a laminated body in a form that the laminated body 20A is processed so as to be used as an element for an actual touch panel sensor. In the laminated body 20, the first metal layer 14 and the second metal layer 16 are partly removed except for necessary portions.

The remaining portions of the first metal layer 14 extend one another in parallel as a large number of metal extra-fine lines S1 to form stripe-shaped pattern electrodes 14D.

Similarly, also as for the second metal layer 16, other excessive portions are removed except for the portions of the extra-fine lines S1 and the extra-fine lines S2 of the remaining portions cover the lower surface, in the drawing, of the extra-fine lines S1 of the first metal layer 14, specifically, of the electrodes 14D.

The laminated body 20 of FIG. 1B can be used with disposing by turning its orientation illustrated in the drawing upside down, at the application to a touch panel sensor, When it is used as such, the light entering upward from the lower side in the drawing, which is to be a viewing side, can be absorbed by the second metal layer 16, specifically by the extra-fine lines S2, to thereby suppress the reflection of the incident light on the electrodes D14, to downward in the drawing.

Accordingly, the impairment of visibility for the display part due to the metal-made electrodes D14 can be substantially prevented.

The laminated body 20 can be also used with disposing it in an orientation as illustrated in FIG. 1B, at the application to a touch panel sensor.

In the case of disposing it in such a manner, the upward outgoing light from the display part of a display device positioned below in the drawing is absorbed by the second metal layer 16, so that the impairment of visibility caused by reflecting the outgoing light to downward, returning the reflection light to the display device side, and projecting the returning light in the displaying portion can be substantially prevented.

Figure 4A:
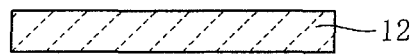
FIG. 4A is an explanatory view illustrating production procedures of the laminated body 20 of FIG. 1B.
Figure 4A:
Figure 4A:
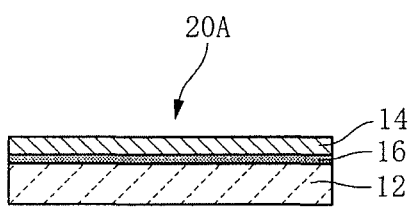
Figure 4A:
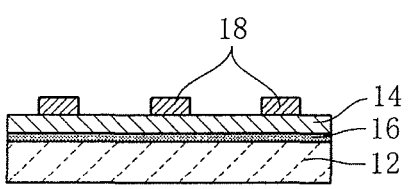
Figure 4A:
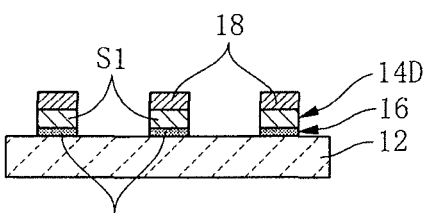
Figure 4A:
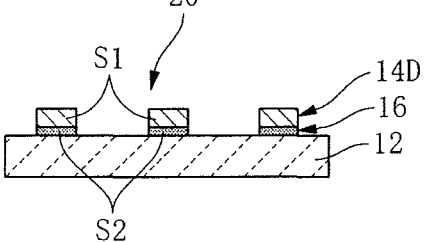

The laminated bodies 20A and 20 can be produced in fundamentally the same procedures as described above. FIG. 4A illustrates an example of the process.

Figure 2A:
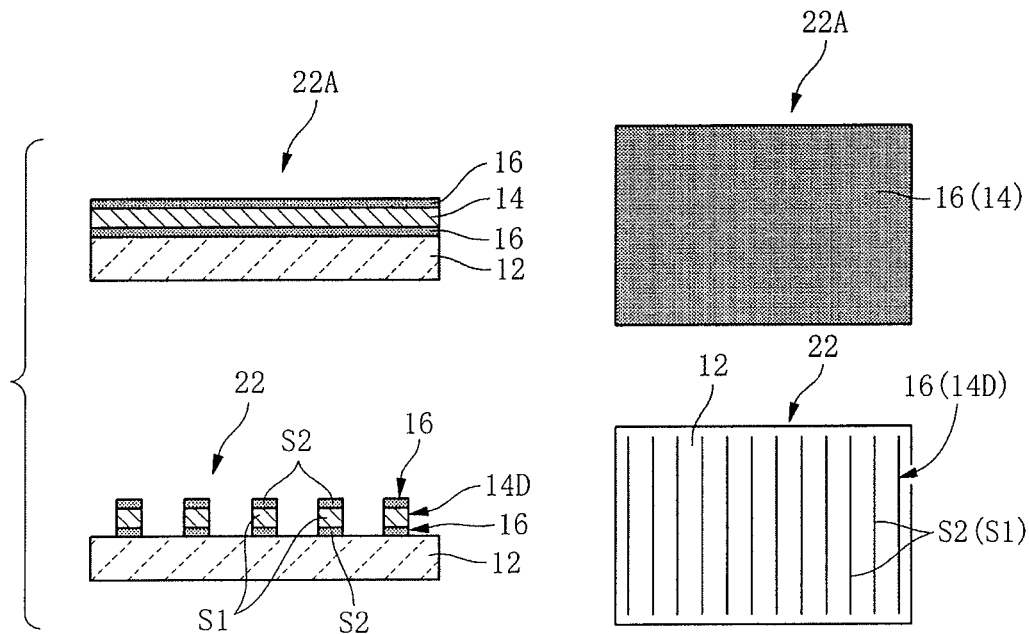
FIG. 2A is a view illustrating a laminated body of further another embodiment of the present invention.

In FIG. 2A, the numeral 22A indicates an example of further another embodiment of the laminated body of the present invention.

In the laminated body 22A, the transparent substrate 12, the second metal layer 16, the first metal layer 14, and the second metal layer 16 are formed in this order upward from a lower side in the drawing.

That is, in the laminated body 22A of this example, the second metal layer 16 to be a dark color layer is formed on the upper surface in the drawing, opposite to the substrate 12, of the first metal layer 14 and also the same second metal layer 16 to be a dark color layer is formed on the lower side of the first metal layer 14, i.e., between the first metal layer 14 and the substrate 12.

In the laminated body 22A, the first metal layer 14 is formed in a film form over the whole surface of the substrate 12 and furthermore, the second metal layer 16 is also formed in a film form over the whole surface of the first metal layer 14.

On the other hand, in the laminated body 22, as for the first metal layer 14, excessive portions are removed with remaining necessary portions and the remaining large number of extra-fine lines S1 are paralleled one another to form stripe-shaped pattern electrodes 14D. Similarly, corresponding to this, also as for the second metal layer 16, the extra-fine lines S2 cover the first metal layer 14, specifically the upper surface and lower surface, in the drawing, of the extra-fine lines S1 of the electrodes 14D to suppress the reflection of upward light and downward light, in the drawing, by the electrodes 14D (extra-fine lines S1).

The laminated body 22 of this example can satisfactorily absorb both of the downward incident light from the upper outside in the drawing and the light emitted upward from the lower display device to enter into the laminated body 22 and thus it can suppress upward reflection and downward reflection in the drawing, when the laminated body is disposed on an upper surface side of a display device in an orientation as illustrated in FIG. 2A, at the application to a touch panel sensor.

Accordingly, even in the case of using the electrodes 14D composed of the metal lines, good visibility for the display part can be secured.

Figure 4B:
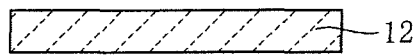
FIG. 4B is an explanatory view illustrating production procedures of the laminated body 22 of FIG. 2A.
Figure 4B:
Figure 4B:
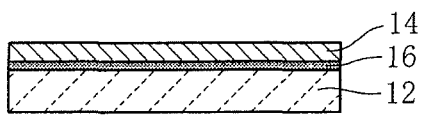
Figure 4B:
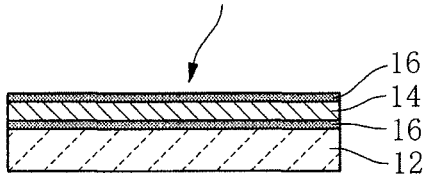
Figure 4B:
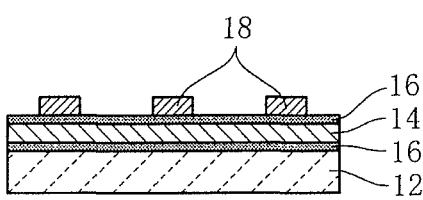
Figure 4B:
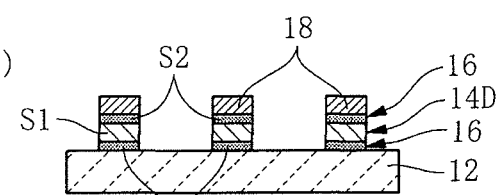
Figure 4B:
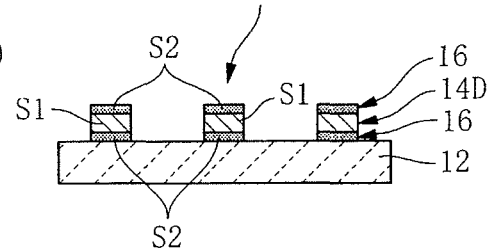

The laminated bodies 22A and 22 of FIG. 2A can be produced in fundamentally the same process as described above. FIG. 4B specifically illustrates the process.

Figure 2B:
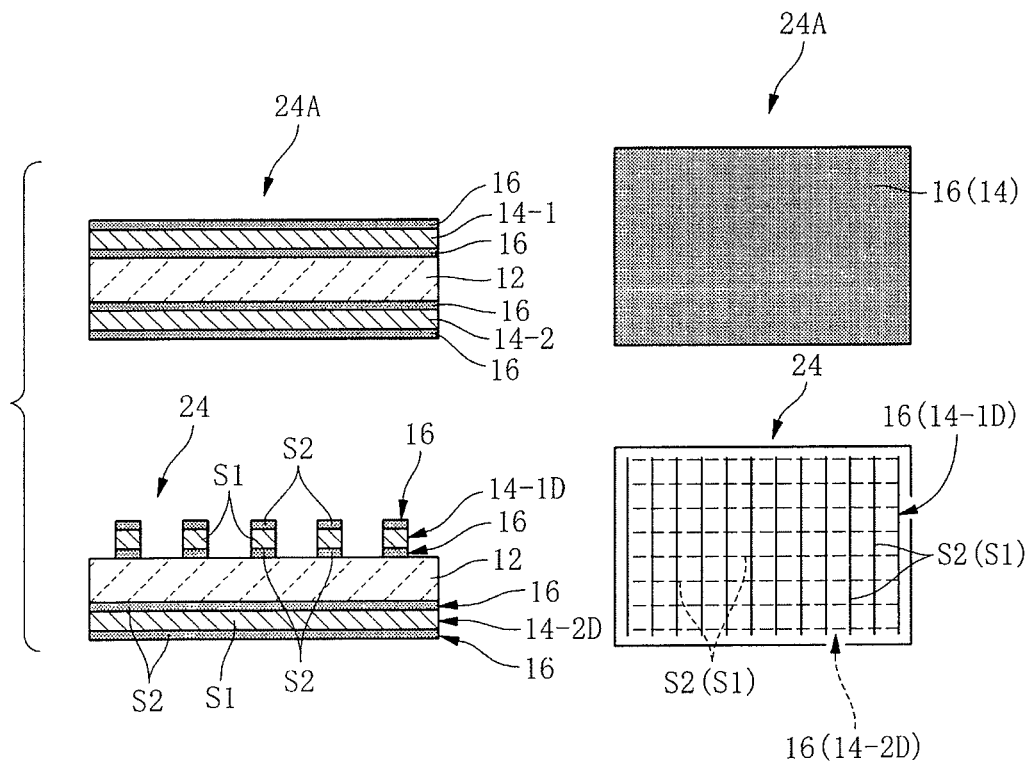
FIG. 2B is a view illustrating a laminated body of further another embodiment of the present invention.

In FIG. 2B, the numeral 24A illustrates an example of further another form of the laminated body of the present invention.

The laminated body 24A of this example is an example in which the first metal layers 14-1 and 14-2 are provided on both of one surface side and the other surface side of the transparent substrate 12, respectively.

The laminated body 24 is obtained by processing the laminated body 24A. In the laminated body 24, to the extra-fine lines S1 constituting one electrodes 14-1D, extra-fine lines S1 constituting the other electrodes 14-2D extend in an orthogonal orientation, and they form a grid-like pattern in plan view as a whole.

That is, the one electrodes 14-1D is configured as X-side electrodes extending to an X-axis direction and the other electrodes 14-2D is configured as Y-side electrodes extending to a Y-axis direction.

Therefore, in the laminated body 24, an operation performed by an operator can be detected and specified as a two-dimensional position information.

Moreover, the laminated body 24 can satisfactorily absorb both of the downward incident light from an upper side in the drawing and the upward incident light from a lower side in the drawing, and thus it can prevent the impairment of visibility resulting from much reflection of the incident light.

Figure 5A:
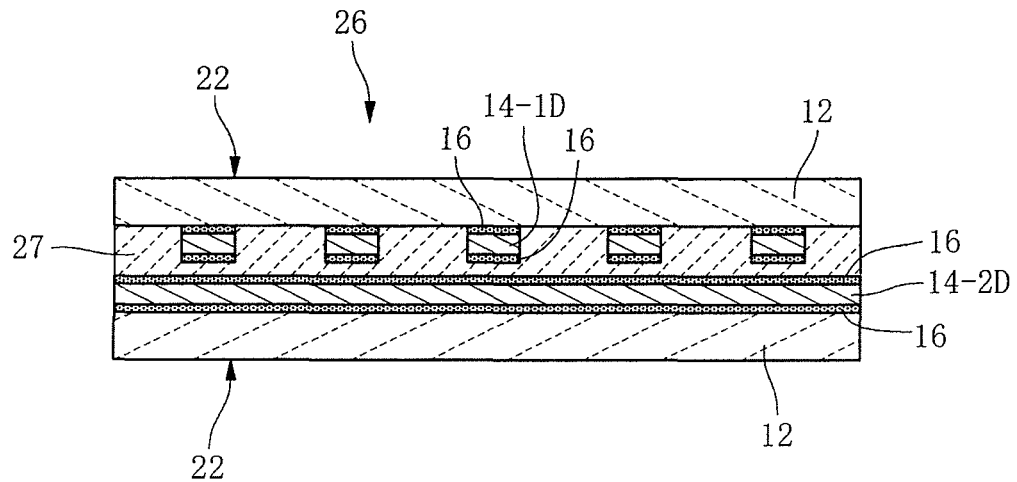
FIG. 5A is a view illustrating an example of a laminate structure of an essential part of a touch panel sensor.
Figure 5B:
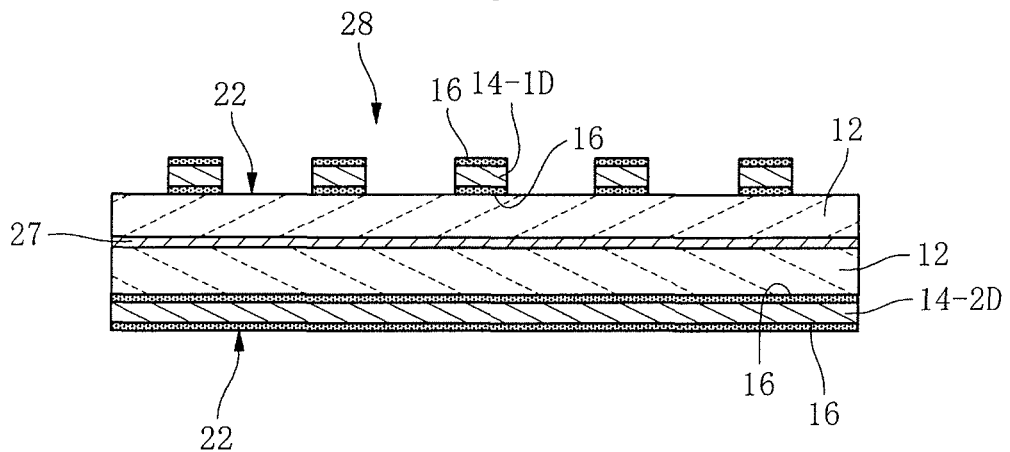
FIG. 5B is a view illustrating another example of a laminate structure of an essential part of a touch panel sensor.
Figure 5C:
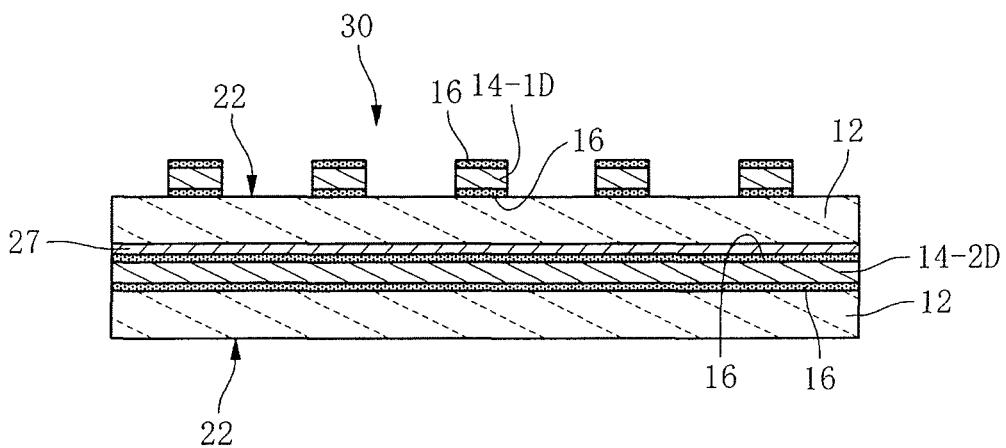
FIG. 5C is a view illustrating further another example of a laminate structure of an essential part of a touch panel sensor.

FIG. 5A, FIG. 5B and FIG. 5C illustrate examples of a laminate structure of an essential portion of a touch panel sensor.

The example of FIG. 5A has a structure in which the transparent substrate 12, the second metal layer 16 as a dark color layer, the Y-side electrodes 14-2D composed of the first metal layer, the second metal layer 16, the second metal layer 16, the X-side electrodes 14-1D composed of the first metal layer, the second metal layer 16, and the transparent substrate 12 are formed upward from a lower side in the drawing.

The laminated body 26 of this example can be configured by overlaying two laminated bodies 22 illustrated in FIG. 2A disposing so that the electrodes 14D (to be 14-1D and 14-2D) face each other in an orthogonal manner, and adhering these two laminated bodies with each other by using an optical adhesive layer (OCA) 27.

The laminated body 26 can absorb the light entering downward from an upper side in the drawing toward the electrode 14-1D by the second metal layer 16 on the upper surface, in the drawing, of the electrode 14-1D, and thus it can suppress the reflection by the electrode 14-1D.

Also, the laminated body 26 can absorb the light entering upward from a lower side in the drawing toward the electrode 14-1D by the second metal layer 16 on the lower surface, in the drawing, of the electrode 14-1D, and thus it can suppress the reflection by the electrode 14-1D.

On the other hand, as for the light entering downward from the upper side in the drawing toward the electrode 14-2D, the light is absorbed by the second metal layer 16 on the upper surface of the electrode 14-2D and thus the upward reflection by the electrode 14-2D can be suppressed.

Also, as for the light entering upward from the lower side in the drawing toward the electrode 14-2D, the light is absorbed by the second metal layer 16 on the lower surface of the electrode 14-2D and thus the downward reflection by the electrode 14-2D can be suppressed.

That is, in the case where the laminated body 26 is disposed on an upper side of the display device placed on a lower side in the drawing, irrespective of the upward or downward direction of the orientation of the laminated body 26, the reflection by the metal-made electrodes can be effectively suppressed for any of the external light entering downward from an upper side in the drawing and the light entering upward from a lower side in the drawing from the display device, and thus the visibility for an indication on the display part can be highly secured against the reflection of light by the electrodes.

The laminated body 28 illustrated in FIG. 5B has a structure in which the second metal layer 16, the Y-side electrodes 14-2D composed of the first metal layer, the second metal layer 16, the transparent substrate 12, the transparent substrate 12, the second metal layer 16, the X-side electrodes 14-1D, and the second metal layer 16 are formed in this order upward from a lower side in the drawing. Even in the laminated body 28 illustrated in FIG. 5B, it can be configured by adhering two laminated bodies 22 of FIG. 2A.

Specifically, the laminated body 28 can be configured by overlaying two laminated bodies 22 back to back at each substrate 12 disposing so that the respective electrodes 14D (to be 14-1D and 14-2D) are reversed in an orthogonal manner, and adhering these two laminated bodies with each other by using the optical adhesive layer 27.

The laminated body 28, similarly to the laminated body 26, in any of the cases where the laminated body 28 is disposed upward or downward orientation, any of the light from the outside and the light from the display device can be satisfactorily absorbed and the reflection thereof can be suppressed, so that the visibility for the display part of the display device can be highly secured.

The laminated body 30 of FIG. 5C has a structure in which the transparent substrate 12, the second metal layer 16, the Y-side electrodes 14-2D, the second metal layer 16, the transparent substrate 12, the second metal layer 16, the X-side electrodes 14-1D, and the second metal layer 16 are formed in this order upward from a lower side in the drawing.

The laminated body 30 illustrated in FIG. 5C can be also easily configured by using the laminated body 22 illustrated in FIG. 2A. Concretely, the laminated body 30 can be configured by overlaying two laminated bodies 22 each in the same orientation disposing so that the respective electrodes 14D (to be 14-2D and 14-1D) are upward in the drawing in an orthogonal manner, and adhering these two laminated bodies with each other by using an optical adhesive layer 27.

The laminated body 30 can exhibit fundamentally the same effect as in the laminated bodies 26 and 28 for the reflection of light.

Figure 6A:
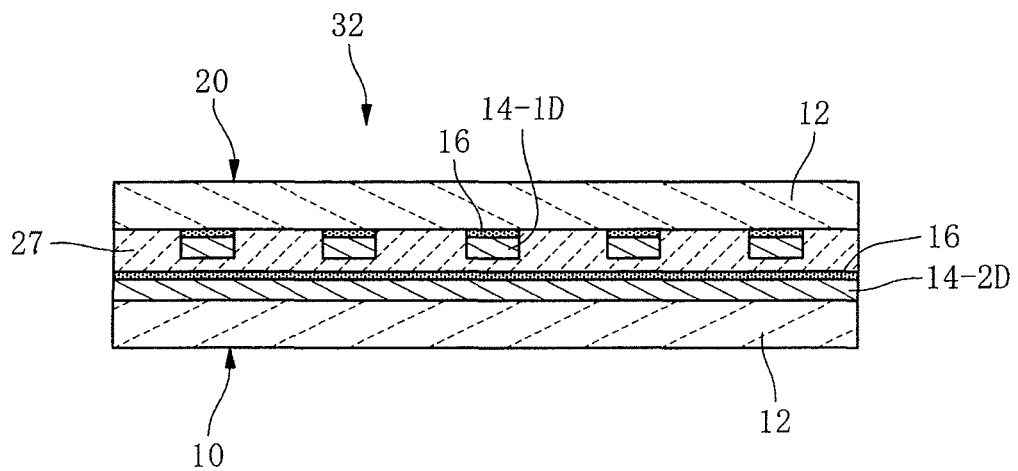
FIG. 6A is a view illustrating further another example of a laminate structure of an essential part of a touch panel sensor.
Figure 6B:
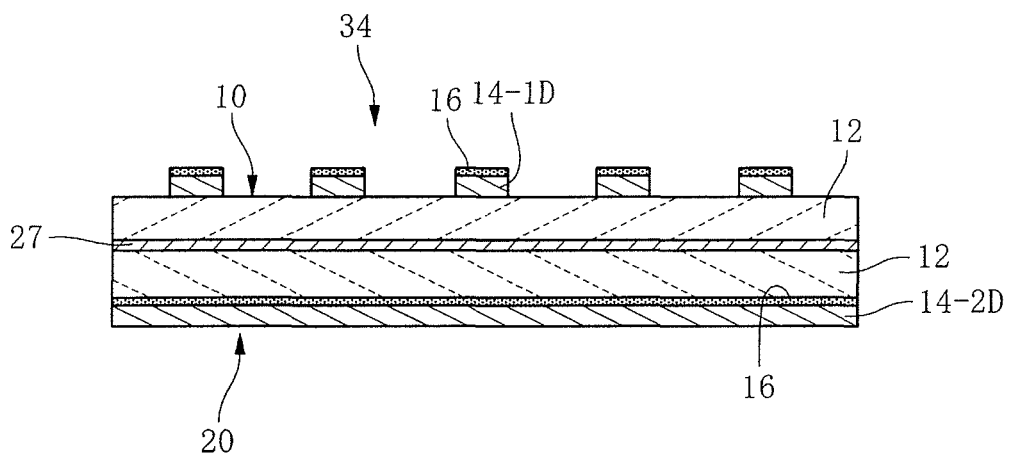
FIG. 6B is a view illustrating further another example of a laminate structure of an essential part of a touch panel sensor.
Figure 6C:
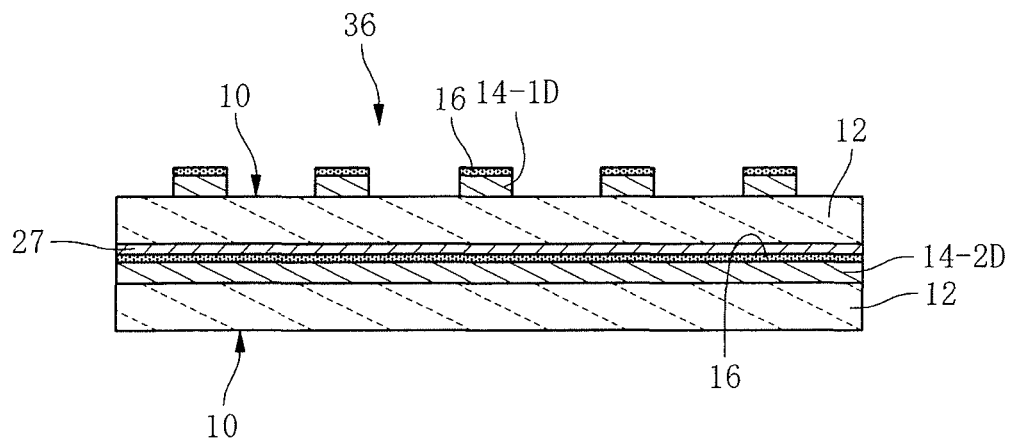
FIG. 6C is a view illustrating further another example of a laminate structure of an essential part of a touch panel sensor.

In the examples illustrated in FIG. 5A, FIG. 5B and FIG. 5C, the second metal layers 16 are provided on the respective upper surfaces and lower surfaces, in the drawing, of the X-side electrodes 14-1D and the Y-side electrodes 14-2D. However, it is also possible to provide the second metal layers 16 on only the respective upper surfaces of the X-side electrodes 14-1D and the Y-side electrodes 14-2D as in laminated bodies 32, 34, and 36 illustrated in FIG. 6A, FIG. 6B, and FIG. 6C.

In these cases, the laminated bodies 32 and 34 can be configured by adhering the laminated body 10 illustrated in FIG. 1A and the laminated body 20 illustrated in FIG. 1B and the laminated body 36 can be configured by adhering two laminated bodies 10 illustrated in FIG. 1A.

As above, some examples of laminate structures in a touch panel sensor are explained but there are other various laminate structures for a touch panel sensor. The laminated body of the present invention can satisfactorily correspond to various types of such laminate structures by changing the combination thereof.

EXAMPLES

The following will specifically describe Examples of the present invention.

Examples 1 to 110

The laminated bodies having respective compositions and respective laminate structures shown in Table 1 were produced as mentioned below and properties thereof, such as film formability, electric resistivity, degree of adhesion, and reflectance were measured by the following methods to perform evaluation.

The composition of the first metal layer shown in Table 1 represents the composition of a target material used in sputtering and the composition of the second metal layer represents the composition of the second metal layer itself prepared by sputtering.

(Production of Various Laminated Bodies)

A sputtering target having a size of 100 mm in diameter×5 mm in length was prepared by cutting out from a metal ingot having a size of 150 mm in diameter×45 mm in length having respective compositions.

A sheet-shaped PET having a size of 50 mm×50 mm×2 mm was used (soda lime glass or the like may be used) as a transparent substrate on which a metal layer (a metal film herein) is to be formed. Various metal layers were formed on the substrate by sputtering.

The non-reactive sputtering for forming the first metal film (first metal layer) was performed with controlling the degree of vacuum to $5 \times 10^{-4}$ Pa and introducing Ar gas (inert gas) into a chamber. It was performed at a sputtering pressure of from 0.1 Pa to 1.0 Pa and an electric power of from 100 W to 500 W.

The reactive sputtering for forming the second metal film (second metal layer) was performed with controlling the degree of vacuum to $5 \times 10^{-4}$ Pa and introducing $O_2$ or $N_2$ gas into a chamber. It was performed at a sputtering pressure of from 0.1 Pa to 1.0 Pa and an electric power of 100 W to 500 W.

(1) Preparation of Laminated Body of Second Metal Film/First Metal Film/Substrate A Cu alloy film having a thickness of 300 nm was formed as a first metal film (first metal layer) on a transparent substrate by sputtering, and then a second metal film (second metal layer) shown in Table 1 was formed in a thickness of 50 nm on the first metal film.

Accordingly, a laminated body of second metal film/first metal film/substrate having a structure in which the first metal film and the second metal film were laminated on the transparent substrate in the order was prepared.

(2) Preparation of Laminated Body of First Metal Film/Second Metal Film/Substrate A second metal film was formed in a thickness of 50 nm on a transparent substrate by sputtering, and then a first metal film (first metal layer) composed of a Cu alloy was formed in a thickness of 300 nm thereon.

Accordingly, a laminated body having a laminate structure of first metal film/second metal film/substrate, which contains a transparent substrate composed of a PET sheet, the second metal film formed on the substrate and the first metal film formed thereon, was prepared.

(3) Preparation of Laminated Body of Second Metal Film/First Metal Film/Second Metal Film/Substrate A second metal film was formed in a thickness of 50 nm on a transparent substrate by sputtering, a first metal film was formed in a thickness of 300 nm thereon and the second metal film was formed in a thickness of 50 nm further thereon.

Accordingly, a laminated body having a laminate structure of second metal film/first metal film/second metal film/substrate, which contains a transparent substrate composed of a PET sheet, the second metal film formed thereon, the first metal film further formed thereon, and the second metal film further formed thereon, was prepared.

(Measurement of Electric Resistivity)

Electric resistivity was measured at five points of a film by a four-probe method and the average value thereof was calculated to obtain the electric resistivity ($\mu\Omega \cdot cm$).

(Adhesiveness Test)

The degree of adhesion of each metal film was evaluated in accordance with JIS K5600-5-6:1999.

(Measurement of Reflectance)

The measurement of reflectance was performed in accordance with JIS K 7105:1981. Specifically, the measurement was performed in a wavelength range of visible light (400 nm to 800 nm) by using an ultraviolet-visible spectrophotometer, the reflectance at every 1 nm of wavelength was measured, and a value of (Sum of reflectance values)/(Wavelength range of visible light)×100 was taken as reflectance.

The measurement of reflectance was conducted both in the reflectance at the time of viewing the first metal film side from the substrate side, i.e., the measurement of reflection light at the time when light entered from the substrate side toward the first metal film and the reflectance at the time of viewing the substrate side from the first metal film side, i.e., the measurement of reflection light at the time when light entered from the first metal film side toward the substrate side.

TABLE 1

| | | Chemical composition (at %) | | | | | | | | | | | | | | |
|---|---|---|---|---|---|---|---|---|---|---|---|---|---|---|---|---|
| | | First metal film | | | | | | | Second metal film | | | | | | | |
| | | Cu | Zn | B | Mg | Al | Ca | Ti | Cr | Cu | Zn | Al | Ti | Sn | Ni | O | N |
| Example | 1 | 98.6 | 0.4 | 1 | — | — | — | — | — | 47.5 | 2 | 0.5 | — | — | — | 50 | — |
| | 2 | 98.6 | 0.4 | — | 1 | — | — | — | — | 47.5 | 2 | 0.5 | — | — | — | 50 | — |
| | 3 | 98.6 | 0.4 | — | — | 1 | — | — | — | 47.5 | 2 | 0.5 | — | — | — | 50 | — |
| | 4 | 98.6 | 0.4 | — | — | — | 1 | — | — | 47.5 | 2 | 0.5 | — | — | — | 50 | — |
| | 5 | 98.6 | 0.4 | — | — | — | — | 1 | — | 47.5 | 2 | 0.5 | — | — | — | 50 | — |
| | 6 | 98.6 | 0.4 | — | — | — | — | — | 1 | 47.5 | 2 | 0.5 | — | — | — | 50 | — |
| | 7 | 95.8 | 4 | 0.2 | — | — | — | — | — | 47.5 | 2 | 0.5 | — | — | — | 50 | — |
| | 8 | 95.8 | 4 | — | 0.2 | — | — | — | — | 47.5 | 2 | 0.5 | — | — | — | 50 | — |
| | 9 | 95.8 | 4 | — | — | 0.2 | — | — | — | 47.5 | 2 | 0.5 | — | — | — | 50 | — |
| | 10 | 95.8 | 4 | — | — | — | 0.2 | — | — | 47.5 | 2 | 0.5 | — | — | — | 50 | — |
| | 11 | 95.8 | 4 | — | — | — | — | 0.2 | — | 47.5 | 2 | 0.5 | — | — | — | 50 | — |
| | 12 | 95.8 | 4 | — | — | — | — | — | 0.2 | 47.5 | 2 | 0.5 | — | — | — | 50 | — |
| | 13 | 91 | 4 | 5 | — | — | — | — | — | 47.5 | 2 | 0.5 | — | — | — | 50 | — |
| | 14 | 91 | 4 | — | 5 | — | — | — | — | 47.5 | 2 | 0.5 | — | — | — | 50 | — |
| | 15 | 91 | 4 | — | — | 5 | — | — | — | 47.5 | 2 | 0.5 | — | — | — | 50 | — |
| | 16 | 91 | 4 | — | — | — | 5 | — | — | 47.5 | 2 | 0.5 | — | — | — | 50 | — |
| | 17 | 91 | 4 | — | — | — | — | 5 | — | 47.5 | 2 | 0.5 | — | — | — | 50 | — |
| | 18 | 91 | 4 | — | — | — | — | — | 5 | 47.5 | 2 | 0.5 | — | — | — | 50 | — |
| | 19 | 92 | 7 | 1 | — | — | — | — | — | 47.5 | 2 | 0.5 | — | — | — | 50 | — |
| | 20 | 92 | 7 | — | 1 | — | — | — | — | 47.5 | 2 | 0.5 | — | — | — | 50 | — |
| | 21 | 92 | 7 | — | — | 1 | — | — | — | 47.5 | 2 | 0.5 | — | — | — | 50 | — |
| | 22 | 92 | 7 | — | — | — | 1 | — | — | 47.5 | 2 | 0.5 | — | — | — | 50 | — |
| | 23 | 92 | 7 | — | — | — | — | 1 | — | 47.5 | 2 | 0.5 | — | — | — | 50 | — |
| | 24 | 92 | 7 | — | — | — | — | — | 1 | 47.5 | 2 | 0.5 | — | — | — | 50 | — |
| | 25 | 95.8 | 4 | 0.2 | — | — | — | — | — | 47.5 | 2 | 0.5 | — | — | — | 50 | — |
| | 26 | 95.8 | 4 | 0.2 | — | — | — | — | — | 47.5 | 2 | 0.5 | — | — | — | 50 | — |
| | 27 | 98.6 | 0.4 | 1 | — | — | — | — | — | 47.5 | 2 | — | 0.5 | — | — | 50 | — |
| | 28 | 98.6 | 0.4 | — | 1 | — | — | — | — | 47.5 | 2 | — | 0.5 | — | — | 50 | — |
| | 29 | 98.6 | 0.4 | — | — | 1 | — | — | — | 47.5 | 2 | — | 0.5 | — | — | 50 | — |
| | 30 | 98.6 | 0.4 | — | — | — | 1 | — | — | 47.5 | 2 | — | 0.5 | — | — | 50 | — |
| | 31 | 98.6 | 0.4 | — | — | — | — | 1 | — | 47.5 | 2 | — | 0.5 | — | — | 50 | — |
| | 32 | 98.6 | 0.4 | — | — | — | — | — | 1 | 47.5 | 2 | — | 0.5 | — | — | 50 | — |
| | 33 | 95.8 | 4 | 0.2 | — | — | — | — | — | 47.5 | 2 | — | 0.5 | — | — | 50 | — |
| | 34 | 95.8 | 4 | — | 0.2 | — | — | — | — | 47.5 | 2 | — | 0.5 | — | — | 50 | — |
| | 35 | 95.8 | 4 | — | — | 0.2 | — | — | — | 47.5 | 2 | — | 0.5 | — | — | 50 | — |
| | 36 | 95.8 | 4 | — | — | — | 0.2 | — | — | 47.5 | 2 | — | 0.5 | — | — | 50 | — |
| | 37 | 95.8 | 4 | — | — | — | — | 0.2 | — | 47.5 | 2 | — | 0.5 | — | — | 50 | — |
| | 38 | 95.8 | 4 | — | — | — | — | — | 0.2 | 47.5 | 2 | — | 0.5 | — | — | 50 | — |
| | 39 | 91 | 4 | 5 | — | — | — | — | — | 47.5 | 2 | — | 0.5 | — | — | 50 | — |
| | 40 | 91 | 4 | — | 5 | — | — | — | — | 47.5 | 2 | — | 0.5 | — | — | 50 | — |
| | 41 | 91 | 4 | — | — | 5 | — | — | — | 47.5 | 2 | — | 0.5 | — | — | 50 | — |
| | 42 | 91 | 4 | — | — | — | 5 | — | — | 47.5 | 2 | — | 0.5 | — | — | 50 | — |
| | 43 | 91 | 4 | — | — | — | — | 5 | — | 47.5 | 2 | — | 0.5 | — | — | 50 | — |
| | 44 | 91 | 4 | — | — | — | — | — | 5 | 47.5 | 2 | — | 0.5 | — | — | 50 | — |
| | 45 | 92 | 7 | 1 | — | — | — | — | — | 47.5 | 2 | — | 0.5 | — | — | 50 | — |
| | 46 | 92 | 7 | — | 1 | — | — | — | — | 47.5 | 2 | — | 0.5 | — | — | 50 | — |
| | 47 | 92 | 7 | — | — | 1 | — | — | — | 47.5 | 2 | — | 0.5 | — | — | 50 | — |
| | 48 | 92 | 7 | — | — | — | 1 | — | — | 47.5 | 2 | — | 0.5 | — | — | 50 | — |
| | 49 | 92 | 7 | — | — | — | — | 1 | — | 47.5 | 2 | — | 0.5 | — | — | 50 | — |
| | 50 | 92 | 7 | — | — | — | — | — | 1 | 47.5 | 2 | — | 0.5 | — | — | 50 | — |
| | 51 | 95.8 | 4 | 0.2 | — | — | — | — | — | 47.5 | 2 | — | 0.5 | — | — | 50 | — |
| | 52 | 95.8 | 4 | 0.2 | — | — | — | — | — | 47.5 | 2 | — | 0.5 | — | — | 50 | — |
| | 53 | 95.8 | 4 | 0.2 | — | — | — | — | — | 71.25 | 3 | 0.75 | — | — | — | — | 25 |
| | 54 | 95.8 | 4 | — | 0.2 | — | — | — | — | 71.25 | 3 | 0.75 | — | — | — | — | 25 |
| | 55 | 95.8 | 4 | — | — | 0.2 | — | — | — | 71.25 | 3 | 0.75 | — | — | — | — | 25 |
| | 56 | 95.8 | 4 | — | — | — | 0.2 | — | — | 71.25 | 3 | 0.75 | — | — | — | — | 25 |
| | 57 | 95.8 | 4 | — | — | — | — | 0.2 | — | 71.25 | 3 | 0.75 | — | — | — | — | 25 |
| | 58 | 95.8 | 4 | — | — | — | — | — | 0.2 | 71.25 | 3 | 0.75 | — | — | — | — | 25 |
| | 59 | 95.8 | 4 | 0.2 | — | — | — | — | — | 71.25 | 3 | 0.75 | — | — | — | — | 25 |
| | 60 | 95.8 | 4 | 0.2 | — | — | — | — | — | 71.25 | 3 | 0.75 | — | — | — | — | 25 |
| | 61 | 95.8 | 4 | 0.2 | — | — | — | — | — | 71.25 | 3 | — | 0.75 | — | — | — | 25 |
| | 62 | 95.8 | 4 | — | 0.2 | — | — | — | — | 71.25 | 3 | — | 0.75 | — | — | — | 25 |
| | 63 | 95.8 | 4 | — | — | 0.2 | — | — | — | 71.25 | 3 | — | 0.75 | — | — | — | 25 |
| | 64 | 95.8 | 4 | — | — | — | 0.2 | — | — | 71.25 | 3 | — | 0.75 | — | — | — | 25 |
| | 65 | 95.8 | 4 | — | — | — | — | 0.2 | — | 71.25 | 3 | — | 0.75 | — | — | — | 25 |
| | 66 | 95.8 | 4 | — | — | — | — | — | 0.2 | 71.25 | 3 | — | 0.75 | — | — | — | 25 |

TABLE 1-continued

|  |  | Chemical composition (at %) | | | | | | | | | | | | | | |
| --- | --- | --- | --- | --- | --- | --- | --- | --- | --- | --- | --- | --- | --- | --- | --- | --- |
|  |  | First metal film | | | | | | | | Second metal film | | | | | | |
|  |  | Cu | Zn | B | Mg | Al | Ca | Ti | Cr | Cu | Zn | Al | Ti | Sn | Ni | O | N |
|  | 67 | 95.8 | 4 | 0.2 | — | — | — | — | — | 71.25 | 3 | — | 0.75 | — | — | — | 25 |
|  | 68 | 95.8 | 4 | 0.2 | — | — | — | — | — | 71.25 | 3 | — | 0.75 | — | — | — | 25 |
|  | 69 | 95.8 | 4 | 0.2 | — | — | — | — | — | 45 | 5 | — | — | — | — | 50 | — |
|  | 70 | 95.8 | 4 | 0.2 | — | — | — | — | — | 40 | 10 | — | — | — | — | 50 | — |
|  | 71 | 95.8 | 4 | 0.2 | — | — | — | — | — | 35 | 15 | — | — | — | — | 50 | — |
|  | 72 | 95.8 | 4 | 0.2 | — | — | — | — | — | 67.5 | 7.5 | — | — | — | — | — | 25 |
|  | 73 | 95.8 | 4 | 0.2 | — | — | — | — | — | 60 | 15 | — | — | — | — | — | 25 |
|  | 74 | 95.8 | 4 | 0.2 | — | — | — | — | — | 52.5 | 22.5 | — | — | — | — | — | 25 |
|  | 75 | 95.8 | 4 | 0.2 | — | — | — | — | — | 49.4 | 0.5 | 0.1 | — | — | — | 50 | — |
|  | 76 | 95.8 | 4 | 0.2 | — | — | — | — | — | 49.25 | 0.5 | 0.25 | — | — | — | 50 | — |
|  | 77 | 95.8 | 4 | 0.2 | — | — | — | — | — | 47 | 0.5 | 2.5 | — | — | — | 50 | — |
|  | 78 | 95.8 | 4 | 0.2 | — | — | — | — | — | 44.9 | 5 | 0.1 | — | — | — | 50 | — |
|  | 79 | 95.8 | 4 | 0.2 | — | — | — | — | — | 44.75 | 5 | 0.25 | — | — | — | 50 | — |
|  | 80 | 95.8 | 4 | 0.2 | — | — | — | — | — | 42.5 | 5 | 2.5 | — | — | — | 50 | — |
|  | 81 | 95.8 | 4 | 0.2 | — | — | — | — | — | 49.4 | 0.5 | — | 0.1 | — | — | 50 | — |
|  | 82 | 95.8 | 4 | 0.2 | — | — | — | — | — | 49.25 | 0.5 | — | 0.25 | — | — | 50 | — |
|  | 83 | 95.8 | 4 | 0.2 | — | — | — | — | — | 47 | 0.5 | — | 2.5 | — | — | 50 | — |
|  | 84 | 95.8 | 4 | 0.2 | — | — | — | — | — | 44.9 | 5 | — | 0.1 | — | — | 50 | — |
|  | 85 | 95.8 | 4 | 0.2 | — | — | — | — | — | 44.75 | 5 | — | 0.25 | — | — | 50 | — |
|  | 86 | 95.8 | 4 | 0.2 | — | — | — | — | — | 42.5 | 5 | — | 2.5 | — | — | 50 | — |
|  | 87 | 95.8 | 4 | 0.2 | — | — | — | — | — | 47.5 | 2 | — | — | 0.5 | — | 50 | — |
|  | 88 | 95.8 | 4 | 0.2 | — | — | — | — | — | 47.5 | 2 | — | — | — | 0.5 | 50 | — |
|  | 89 | 95.8 | 4 | 0.2 | — | — | — | — | — | 57 | 2.4 | 0.6 | — | — | — | 40 | — |
|  | 90 | 95.8 | 4 | 0.2 | — | — | — | — | — | 66.5 | 2.8 | 0.7 | — | — | — | 30 | — |
|  | 91 | 95.8 | 4 | 0.2 | — | — | — | — | — | 57 | 2.4 | — | 0.6 | — | — | 40 | — |
|  | 92 | 95.8 | 4 | 0.2 | — | — | — | — | — | 66.5 | 2.8 | — | 0.7 | — | — | 30 | — |
|  | 93 | 95.8 | 4 | 0.2 | — | — | — | — | — | 74.1 | 0.75 | 0.15 | — | — | — | — | 25 |
|  | 94 | 95.8 | 4 | 0.2 | — | — | — | — | — | 73.88 | 0.75 | 0.375 | — | — | — | — | 25 |
|  | 95 | 95.8 | 4 | 0.2 | — | — | — | — | — | 70.5 | 0.75 | 3.75 | — | — | — | — | 25 |
|  | 96 | 95.8 | 4 | 0.2 | — | — | — | — | — | 67.35 | 7.5 | 0.15 | — | — | — | — | 25 |
|  | 97 | 95.8 | 4 | 0.2 | — | — | — | — | — | 67.13 | 7.5 | 0.375 | — | — | — | — | 25 |
|  | 98 | 95.8 | 4 | 0.2 | — | — | — | — | — | 63.75 | 7.5 | 3.75 | — | — | — | — | 25 |
|  | 99 | 95.8 | 4 | 0.2 | — | — | — | — | — | 74.1 | 0.75 | — | 0.15 | — | — | — | 25 |
|  | 100 | 95.8 | 4 | 0.2 | — | — | — | — | — | 73.88 | 0.75 | — | 0.375 | — | — | — | 25 |
|  | 101 | 95.8 | 4 | 0.2 | — | — | — | — | — | 70.5 | 0.75 | — | 3.75 | — | — | — | 25 |
|  | 102 | 95.8 | 4 | 0.2 | — | — | — | — | — | 67.35 | 7.5 | — | 0.15 | — | — | — | 25 |
|  | 103 | 95.8 | 4 | 0.2 | — | — | — | — | — | 67.13 | 7.5 | — | 0.375 | — | — | — | 25 |
|  | 104 | 95.8 | 4 | 0.2 | — | — | — | — | — | 63.75 | 7.5 | — | 3.75 | — | — | — | 25 |
|  | 105 | 95.8 | 4 | 0.2 | — | — | — | — | — | 71.25 | 3 | — | — | 0.75 | — | — | 25 |
|  | 106 | 95.8 | 4 | 0.2 | — | — | — | — | — | 71.25 | 3 | — | — | — | 0.75 | — | 25 |
|  | 107 | 95.8 | 4 | 0.2 | — | — | — | — | — | 76 | 3.2 | 0.8 | — | — | — | — | 20 |
|  | 108 | 95.8 | 4 | 0.2 | — | — | — | — | — | 80.75 | 3.4 | 0.85 | — | — | — | — | 15 |
|  | 109 | 95.8 | 4 | 0.2 | — | — | — | — | — | 76 | 3.2 | — | 0.8 | — | — | — | 20 |
|  | 110 | 95.8 | 4 | 0.2 | — | — | — | — | — | 80.75 | 3.4 | — | 0.85 | — | — | — | 15 |
| Comparative Example | 1 | 100 | — | — | — | — | — | — | — | — | — | — | — | — | — | — | — |
|  | 2 | 99.96 | 0.04 | — | — | — | — | — | — | — | — | — | — | — | — | — | — |
|  | 3 | 96 | 4 | — | — | — | — | — | — | — | — | — | — | — | — | — | — |
|  | 4 | 96 | — | 4 | — | — | — | — | — | — | — | — | — | — | — | — | — |
|  | 5 | 96 | — | — | 4 | — | — | — | — | — | — | — | — | — | — | — | — |
|  | 6 | 96 | — | — | — | 4 | — | — | — | — | — | — | — | — | — | — | — |
|  | 7 | 96 | — | — | — | — | 4 | — | — | — | — | — | — | — | — | — | — |
|  | 8 | 96 | — | — | — | — | — | 4 | — | — | — | — | — | — | — | — | — |
|  | 9 | 96 | — | — | — | — | — | — | 4 | — | — | — | — | — | — | — | — |
|  | 10 | 97.9 | 0.1 | 2 | — | — | — | — | — | — | — | — | — | — | — | — | — |
|  | 11 | 97.9 | 0.1 | — | 2 | — | — | — | — | — | — | — | — | — | — | — | — |
|  | 12 | 97.9 | 0.1 | — | — | 2 | — | — | — | — | — | — | — | — | — | — | — |
|  | 13 | 97.9 | 0.1 | — | — | — | 2 | — | — | — | — | — | — | — | — | — | — |
|  | 14 | 97.9 | 0.1 | — | — | — | — | 2 | — | — | — | — | — | — | — | — | — |
|  | 15 | 97.9 | 0.1 | — | — | — | — | — | 2 | — | — | — | — | — | — | — | — |
|  | 16 | 95.98 | 4 | 0.02 | — | — | — | — | — | — | — | — | — | — | — | — | — |
|  | 17 | 95.98 | 4 | — | 0.02 | — | — | — | — | — | — | — | — | — | — | — | — |
|  | 18 | 95.98 | 4 | — | — | 0.02 | — | — | — | — | — | — | — | — | — | — | — |
|  | 19 | 95.98 | 4 | — | — | — | 0.02 | — | — | — | — | — | — | — | — | — | — |
|  | 20 | 95.98 | 4 | — | — | — | — | 0.02 | — | — | — | — | — | — | — | — | — |
|  | 21 | 95.98 | 4 | — | — | — | — | — | 0.02 | — | — | — | — | — | — | — | — |
|  | 22 | 87 | 4 | 9 | — | — | — | — | — | — | — | — | — | — | — | — | — |
|  | 23 | 87 | 4 | — | 9 | — | — | — | — | — | — | — | — | — | — | — | — |
|  | 24 | 87 | 4 | — | — | 9 | — | — | — | — | — | — | — | — | — | — | — |
|  | 25 | 87 | 4 | — | — | — | 9 | — | — | — | — | — | — | — | — | — | — |
|  | 26 | 87 | 4 | — | — | — | — | 9 | — | — | — | — | — | — | — | — | — |
|  | 27 | 87 | 4 | — | — | — | — | — | 9 | — | — | — | — | — | — | — | — |
|  | 28 | 88 | 12 | — | — | — | — | — | — | — | — | — | — | — | — | — | — |
|  | 29 | 87 | 12 | 1 | — | — | — | — | — | — | — | — | — | — | — | — | — |
|  | 30 | 87 | 12 | — | 1 | — | — | — | — | — | — | — | — | — | — | — | — |

TABLE 1-continued

| | | Chemical composition (at %) | | | | | | | | | | | | | | |
|---|---|---|---|---|---|---|---|---|---|---|---|---|---|---|---|---|
| | | First metal film | | | | | | | Second metal film | | | | | | | |
| | | Cu | Zn | B | Mg | Al | Ca | Ti | Cr | Cu | Zn | Al | Ti | Sn | Ni | O | N |
| | 31 | 87 | 12 | — | — | 1 | — | — | — | — | — | — | — | — | — | — | — |
| | 32 | 87 | 12 | — | — | — | 1 | — | — | — | — | — | — | — | — | — | — |
| | 33 | 87 | 12 | — | — | — | — | 1 | — | — | — | — | — | — | — | — | — |
| | 34 | 87 | 12 | — | — | — | — | — | 1 | — | — | — | — | — | — | — | — |
| | 35 | 95.8 | 4 | 0.2 | — | — | — | — | — | 25 | 25 | — | — | — | — | 50 | — |
| | 36 | 95.8 | 4 | 0.2 | — | — | — | — | — | 33 | 2 | 15 | — | — | — | 50 | — |
| | 37 | 95.8 | 4 | 0.2 | — | — | — | — | — | 33 | 2 | — | 15 | — | — | 50 | — |
| | 38 | 95.8 | 4 | 0.2 | — | — | — | — | — | 37.5 | 37.5 | — | — | — | — | — | 25 |
| | 39 | 95.8 | 4 | 0.2 | — | — | — | — | — | 49.5 | 3 | 22.5 | — | — | — | — | 25 |
| | 40 | 95.8 | 4 | 0.2 | — | — | — | — | — | 49.5 | 3 | — | 22.5 | — | — | — | 25 |
| | 41 | 95.8 | 4 | 0.2 | — | — | — | — | — | 50 | — | — | — | — | — | 50 | — |
| | 42 | 95.8 | 4 | 0.2 | — | — | — | — | — | 49.5 | — | 0.5 | — | — | — | 50 | — |
| | 43 | 95.8 | 4 | 0.2 | — | — | — | — | — | 75 | — | — | — | — | — | — | 25 |
| | 44 | 95.8 | 4 | 0.2 | — | — | — | — | — | 74.25 | — | — | 0.75 | — | — | — | 25 |
| | 45 | 95.8 | 4 | 0.2 | — | — | — | — | — | 95 | 4 | 1 | — | — | — | — | — |
| | 46 | 95.8 | 4 | 0.2 | — | — | — | — | — | 85.5 | 3.6 | 0.9 | — | — | — | 10 | — |
| | 47 | 95.8 | 4 | 0.2 | — | — | — | — | — | 76 | 3.2 | 0.8 | — | — | — | 20 | — |
| | 48 | 95.8 | 4 | 0.2 | — | — | — | — | — | 95 | 4 | — | 1 | — | — | — | — |
| | 49 | 95.8 | 4 | 0.2 | — | — | — | — | — | 85.5 | 3.6 | — | 0.9 | — | — | 10 | — |
| | 50 | 95.8 | 4 | 0.2 | — | — | — | — | — | 76 | 3.2 | — | 0.8 | — | — | 20 | — |
| | 51 | 95.8 | 4 | 0.2 | — | — | — | — | — | 90.25 | 3.8 | 0.95 | — | — | — | — | 5 |
| | 52 | 95.8 | 4 | 0.2 | — | — | — | — | — | 85.5 | 3.6 | 0.9 | — | — | — | — | 10 |
| | 53 | 95.8 | 4 | 0.2 | — | — | — | — | — | 90.25 | 3.8 | — | 0.95 | — | — | — | 5 |
| | 54 | 95.8 | 4 | 0.2 | — | — | — | — | — | 85.5 | 3.6 | — | 0.9 | — | — | — | 10 |

Comparative Examples 1 to 54

A first metal film was formed on a transparent substrate by using a target of pure Cu or a Cu alloy in the same manner as in Examples without formation of the second metal film to obtain respective laminated bodies (Comparative Examples 1 to 34). Further, there were also prepared laminated bodies having a laminate structure of first metal film/second metal film/substrate in which the composition of the first metal film was constant and only the composition of the second metal film was changed (Comparative Examples 35 to 54). Then, for each laminated body, evaluation on various properties was conducted in the same manner as in Examples. The results are shown in Table 2.

TABLE 2

| | | Properties | | | | | | | | | |
|---|---|---|---|---|---|---|---|---|---|---|---|
| | | Film formability | | Electric resistivity (µΩ · cm) | | Adhesiveness | | Reflectance (%) | | Visibility | |
| | | 1st metal film | 2nd metal film | 1st metal film | 2nd metal film | 1st metal film | 2nd metal film | Metal film side | Substrate side | Metal film side | Substrate side | Structure |
| Example | 1 | good | good | 6.5 | | good | good | 66.62 | 10.83 | bad | good | 1st metal/2nd metal/Substrate |
| | 2 | good | good | 7.6 | | good | good | 65.91 | 9.00 | bad | good | 1st metal/2nd metal/Substrate |
| | 3 | good | good | 7.0 | | good | good | 64.54 | 8.42 | bad | good | 1st metal/2nd metal/Substrate |
| | 4 | good | good | 7.7 | | good | good | 62.26 | 13.21 | bad | good | 1st metal/2nd metal/Substrate |
| | 5 | good | good | 6.5 | | good | good | 68.32 | 11.34 | bad | good | 1st metal/2nd metal/Substrate |
| | 6 | good | good | 6.9 | | good | good | 66.28 | 8.44 | bad | good | 1st metal/2nd metal/Substrate |
| | 7 | good | good | 5.3 | | good | good | 68.33 | 12.67 | bad | good | 1st metal/2nd metal/Substrate |
| | 8 | good | good | 5.6 | | good | good | 64.81 | 11.95 | bad | good | 1st metal/2nd metal/Substrate |
| | 9 | good | good | 5.7 | | good | good | 67.85 | 13.73 | bad | good | 1st metal/2nd metal/Substrate |
| | 10 | good | good | 6.1 | | good | good | 65.46 | 13.71 | bad | good | 1st metal/2nd metal/Substrate |
| | 11 | good | good | 5.0 | | good | good | 64.48 | 9.34 | bad | good | 1st metal/2nd metal/Substrate |
| | 12 | good | good | 5.1 | | good | good | 65.43 | 10.86 | bad | good | 1st metal/2nd metal/Substrate |
| | 13 | good | good | 6.5 | | good | good | 62.76 | 13.38 | bad | good | 1st metal/2nd metal/Substrate |
| | 14 | good | good | 7.8 | | good | good | 66.03 | 11.67 | bad | good | 1st metal/2nd metal/Substrate |
| | 15 | good | good | 7.4 | | good | good | 67.89 | 10.06 | bad | good | 1st metal/2nd metal/Substrate |
| | 16 | good | good | 7.6 | | good | good | 64.18 | 8.21 | bad | good | 1st metal/2nd metal/Substrate |
| | 17 | good | good | 6.4 | | good | good | 64.82 | 9.05 | bad | good | 1st metal/2nd metal/Substrate |
| | 18 | good | good | 6.2 | | good | good | 65.44 | 8.87 | bad | good | 1st metal/2nd metal/Substrate |
| | 19 | good | good | 6.3 | | good | good | 63.79 | 10.44 | bad | good | 1st metal/2nd metal/Substrate |
| | 20 | good | good | 6.9 | | good | good | 62.91 | 9.63 | bad | good | 1st metal/2nd metal/Substrate |
| | 21 | good | good | 6.5 | | good | good | 63.84 | 11.67 | bad | good | 1st metal/2nd metal/Substrate |
| | 22 | good | good | 7.4 | | good | good | 67.19 | 11.48 | bad | good | 1st metal/2nd metal/Substrate |
| | 23 | good | good | 6.1 | | good | good | 67.10 | 12.28 | bad | good | 1st metal/2nd metal/Substrate |
| | 24 | good | good | 7.4 | | good | good | 67.75 | 12.12 | bad | good | 1st metal/2nd metal/Substrate |
| | 25 | good | good | | | good | good | 11.70 | 68.09 | good | bad | 2nd metal/1st metal/Substrate |
| | 26 | good | good | | | good | good | 12.48 | 9.21 | good | good | 2nd/1st/2nd/Substrate |

TABLE 2-continued

| | Film formability | | Electric resistivity (μΩ·cm) | | Adhesiveness | | Reflectance (%) | | Visibility | | |
|---|---|---|---|---|---|---|---|---|---|---|---|
| | 1st metal film | 2nd metal film | 1st metal film | 2nd metal film | 1st metal film | 2nd metal film | Metal film side | Substrate side | Metal film side | Substrate side | Structure |
| 27 | good | good | 6.5 | | good | good | 62.75 | 11.38 | bad | good | 1st metal/2nd metal/Substrate |
| 28 | good | good | 7.7 | | good | good | 65.40 | 13.56 | bad | good | 1st metal/2nd metal/Substrate |
| 29 | good | good | 7.0 | | good | good | 66.34 | 10.89 | bad | good | 1st metal/2nd metal/Substrate |
| 30 | good | good | 7.7 | | good | good | 62.22 | 10.10 | bad | good | 1st metal/2nd metal/Substrate |
| 31 | good | good | 6.3 | | good | good | 68.14 | 8.20 | bad | good | 1st metal/2nd metal/Substrate |
| 32 | good | good | 6.7 | | good | good | 62.45 | 8.96 | bad | good | 1st metal/2nd metal/Substrate |
| 33 | good | good | 4.9 | | good | good | 63.32 | 11.23 | bad | good | 1st metal/2nd metal/Substrate |
| 34 | good | good | 5.3 | | good | good | 66.99 | 9.84 | bad | good | 1st metal/2nd metal/Substrate |
| 35 | good | good | 5.4 | | good | good | 61.89 | 10.83 | bad | good | 1st metal/2nd metal/Substrate |
| 36 | good | good | 6.3 | | good | good | 63.27 | 9.92 | bad | good | 1st metal/2nd metal/Substrate |
| 37 | good | good | 5.1 | | good | good | 62.38 | 12.01 | bad | good | 1st metal/2nd metal/Substrate |
| 38 | good | good | 5.3 | | good | good | 66.27 | 13.85 | bad | good | 1st metal/2nd metal/Substrate |
| 39 | good | good | 6.5 | | good | good | 63.64 | 11.34 | bad | good | 1st metal/2nd metal/Substrate |
| 40 | good | good | 7.7 | | good | good | 63.22 | 12.80 | bad | good | 1st metal/2nd metal/Substrate |
| 41 | good | good | 7.3 | | good | good | 68.88 | 10.31 | bad | good | 1st metal/2nd metal/Substrate |
| 42 | good | good | 7.6 | | good | good | 67.20 | 12.26 | bad | good | 1st metal/2nd metal/Substrate |
| 43 | good | good | 6.5 | | good | good | 67.97 | 12.15 | bad | good | 1st metal/2nd metal/Substrate |
| 44 | good | good | 6.5 | | good | good | 65.32 | 10.97 | bad | good | 1st metal/2nd metal/Substrate |
| 45 | good | good | 6.3 | | good | good | 67.08 | 11.44 | bad | good | 1st metal/2nd metal/Substrate |
| 46 | good | good | 6.6 | | good | good | 62.81 | 13.12 | bad | good | 1st metal/2nd metal/Substrate |
| 47 | good | good | 6.7 | | good | good | 62.54 | 11.47 | bad | good | 1st metal/2nd metal/Substrate |
| 48 | good | good | 7.6 | | good | good | 66.54 | 13.48 | bad | good | 1st metal/2nd metal/Substrate |
| 49 | good | good | 6.1 | | good | good | 67.77 | 11.27 | bad | good | 1st metal/2nd metal/Substrate |
| 50 | good | good | 7.8 | | good | good | 63.89 | 9.12 | bad | good | 1st metal/2nd metal/Substrate |
| 51 | good | good | | | good | good | 13.34 | 67.68 | good | bad | 2nd metal/1st metal/Substrate |
| 52 | good | good | | | good | good | 9.90 | 11.52 | good | good | 2nd/1st/2nd/Substrate |
| 53 | good | good | 5.1 | | good | good | 64.77 | 10.93 | bad | good | 1st metal/2nd metal/Substrate |
| 54 | good | good | 5.1 | | good | good | 65.36 | 11.88 | bad | good | 1st metal/2nd metal/Substrate |
| 55 | good | good | 5.3 | | good | good | 64.14 | 11.51 | bad | good | 1st metal/2nd metal/Substrate |
| 56 | good | good | 6.5 | | good | good | 63.53 | 12.55 | bad | good | 1st metal/2nd metal/Substrate |
| 57 | good | good | 5.3 | | good | good | 64.63 | 10.12 | bad | good | 1st metal/2nd metal/Substrate |
| 58 | good | good | 5.2 | | good | good | 67.85 | 10.39 | bad | good | 1st metal/2nd metal/Substrate |
| 59 | good | good | | | good | good | 13.40 | 67.58 | good | bad | 2nd metal/1st metal/Substrate |
| 60 | good | good | | | good | good | 9.17 | 12.25 | good | good | 2nd/1st/2nd/Substrate |
| 61 | good | good | 5.0 | | good | good | 64.12 | 11.23 | bad | good | 1st metal/2nd metal/Substrate |
| 62 | good | good | 5.2 | | good | good | 61.36 | 9.84 | bad | good | 1st metal/2nd metal/Substrate |
| 63 | good | good | 5.2 | | good | good | 64.45 | 10.83 | bad | good | 1st metal/2nd metal/Substrate |
| 64 | good | good | 6.2 | | good | good | 68.06 | 9.92 | bad | good | 1st metal/2nd metal/Substrate |
| 65 | good | good | 5.3 | | good | good | 61.80 | 12.01 | bad | good | 1st metal/2nd metal/Substrate |
| 66 | good | good | 5.0 | | good | good | 63.28 | 13.85 | bad | good | 1st metal/2nd metal/Substrate |
| 67 | good | good | | | good | good | 11.15 | 66.88 | good | bad | 2nd metal/1st metal/Substrate |
| 68 | good | good | | | good | good | 9.49 | 9.54 | good | good | 2nd/1st/2nd/Substrate |
| 69 | good | good | 5.4 | | good | good | | 13.97 | bad | good | 1st metal/2nd metal/Substrate |
| 70 | good | good | 5.5 | | good | good | | 14.12 | bad | good | 1st metal/2nd metal/Substrate |
| 71 | good | good | 5.9 | | good | good | | 15.58 | bad | good | 1st metal/2nd metal/Substrate |
| 72 | good | good | 5.8 | | good | good | | 16.77 | bad | good | 1st metal/2nd metal/Substrate |
| 73 | good | good | 5.2 | | good | good | | 13.10 | bad | good | 1st metal/2nd metal/Substrate |
| 74 | good | good | 5.2 | | good | good | | 12.83 | bad | good | 1st metal/2nd metal/Substrate |
| 75 | good | good | 5.7 | | good | good | | 11.15 | bad | good | 1st metal/2nd metal/Substrate |
| 76 | good | good | 5.2 | | good | good | | 12.60 | bad | good | 1st metal/2nd metal/Substrate |
| 77 | good | good | 5.9 | | good | good | | 11.54 | bad | good | 1st metal/2nd metal/Substrate |
| 78 | good | good | 5.1 | | good | good | | 12.63 | bad | good | 1st metal/2nd metal/Substrate |
| 79 | good | good | 5.1 | | good | good | | 11.28 | bad | good | 1st metal/2nd metal/Substrate |
| 80 | good | good | 5.7 | | good | good | | 12.07 | bad | good | 1st metal/2nd metal/Substrate |
| 81 | good | good | 5.1 | | good | good | | 11.43 | bad | good | 1st metal/2nd metal/Substrate |
| 82 | good | good | 5.5 | | good | good | | 10.67 | bad | good | 1st metal/2nd metal/Substrate |
| 83 | good | good | 5.9 | | good | good | | 9.28 | bad | good | 1st metal/2nd metal/Substrate |
| 84 | good | good | 5.7 | | good | good | | 10.43 | bad | good | 1st metal/2nd metal/Substrate |
| 85 | good | good | 5.0 | | good | good | | 11.46 | bad | good | 1st metal/2nd metal/Substrate |
| 86 | good | good | 5.5 | | good | good | | 12.90 | bad | good | 1st metal/2nd metal/Substrate |
| 87 | good | good | 5.3 | | good | good | | 13.98 | bad | good | 1st metal/2nd metal/Substrate |
| 88 | good | good | 5.2 | | good | good | | 10.58 | bad | good | 1st metal/2nd metal/Substrate |
| 89 | good | good | 5.4 | | good | good | | 14.72 | bad | good | 1st metal/2nd metal/Substrate |
| 90 | good | good | 5.8 | | good | good | | 10.38 | bad | good | 1st metal/2nd metal/Substrate |
| 91 | good | good | 5.3 | | good | good | | 12.99 | bad | good | 1st metal/2nd metal/Substrate |
| 92 | good | good | 5.5 | | good | good | | 16.37 | bad | good | 1st metal/2nd metal/Substrate |
| 93 | good | good | 5.4 | | good | good | | 15.60 | bad | good | 1st metal/2nd metal/Substrate |
| 94 | good | good | 5.7 | | good | good | | 10.15 | bad | good | 1st metal/2nd metal/Substrate |
| 95 | good | good | 5.6 | | good | good | | 12.64 | bad | good | 1st metal/2nd metal/Substrate |
| 96 | good | good | 5.4 | | good | good | | 10.86 | bad | good | 1st metal/2nd metal/Substrate |
| 97 | good | good | 5.1 | | good | good | | 12.11 | bad | good | 1st metal/2nd metal/Substrate |

TABLE 2-continued

|  |  | Properties |  |  |  |  |  |  |  |  |  |
|---|---|---|---|---|---|---|---|---|---|---|---|
|  |  | Film formability | | Electric resistivity (μΩ·cm) | | Adhesiveness | | Reflectance (%) | | Visibility | | |
|  |  | 1st metal film | 2nd metal film | 1st metal film | 2nd metal film | 1st metal film | 2nd metal film | Metal film side | Substrate side | Metal film side | Substrate side | Structure |
|  | 98 | good | good | 5.7 | | good | good | | 15.24 | bad | good | 1st metal/2nd metal/Substrate |
|  | 99 | good | good | 5.8 | | good | good | | 15.88 | bad | good | 1st metal/2nd metal/Substrate |
|  | 100 | good | good | 5.2 | | good | good | | 11.53 | bad | good | 1st metal/2nd metal/Substrate |
|  | 101 | good | good | 5.5 | | good | good | | 11.17 | bad | good | 1st metal/2nd metal/Substrate |
|  | 102 | good | good | 5.6 | | good | good | | 10.22 | bad | good | 1st metal/2nd metal/Substrate |
|  | 103 | good | good | 5.1 | | good | good | | 10.29 | bad | good | 1st metal/2nd metal/Substrate |
|  | 104 | good | good | 5.8 | | good | good | | 14.50 | bad | good | 1st metal/2nd metal/Substrate |
|  | 105 | good | good | 5.5 | | good | good | | 13.01 | bad | good | 1st metal/2nd metal/Substrate |
|  | 106 | good | good | 5.2 | | good | good | | 14.93 | bad | good | 1st metal/2nd metal/Substrate |
|  | 107 | good | good | 5.3 | | good | good | | 16.22 | bad | good | 1st metal/2nd metal/Substrate |
|  | 108 | good | good | 5.6 | | good | good | | 19.10 | bad | good | 1st metal/2nd metal/Substrate |
|  | 109 | good | good | 5.7 | | good | good | | 13.72 | bad | good | 1st metal/2nd metal/Substrate |
|  | 110 | good | good | 5.1 | | good | good | | 17.92 | bad | good | 1st metal/2nd metal/Substrate |
| Comp. Ex. | 1 | bad | | | | | | | | | | 1st metal/Substrate |
|  | 2 | bad | | | | | | | | | | 1st metal/Substrate |
|  | 3 | good | | 6.4 | | bad | | 68.66 | 61.64 | bad | bad | 1st metal/Substrate |
|  | 4 | good | | 11.9 | | bad | | 67.78 | 66.06 | bad | bad | 1st metal/Substrate |
|  | 5 | good | | 12.4 | | bad | | 67.18 | 65.54 | bad | bad | 1st metal/Substrate |
|  | 6 | good | | 10.6 | | bad | | 68.97 | 65.79 | bad | bad | 1st metal/Substrate |
| Comparative Example | 7 | good | | 13.5 | | bad | | 61.50 | 65.87 | bad | bad | 1st metal/Substrate |
|  | 8 | good | | 17.9 | | bad | | 68.80 | 67.25 | bad | bad | 1st metal/Substrate |
|  | 9 | good | | 14.1 | | bad | | 63.60 | 63.50 | bad | bad | 1st metal/Substrate |
|  | 10 | good | | 7.5 | | good | | 64.72 | 65.85 | bad | bad | 1st metal/Substrate |
|  | 11 | good | | 6.9 | | good | | 65.30 | 68.94 | bad | bad | 1st metal/Substrate |
|  | 12 | good | | 7.6 | | good | | 63.05 | 64.05 | bad | bad | 1st metal/Substrate |
|  | 13 | good | | 6.3 | | good | | 65.38 | 61.52 | bad | bad | 1st metal/Substrate |
|  | 14 | good | | 7.5 | | good | | 62.73 | 66.77 | bad | bad | 1st metal/Substrate |
|  | 15 | good | | 7.5 | | good | | 63.38 | 64.11 | bad | bad | 1st metal/Substrate |
|  | 16 | good | | 6.4 | | bad | | 63.00 | 64.03 | bad | bad | 1st metal/Substrate |
|  | 17 | good | | 6.7 | | bad | | 63.30 | 62.66 | bad | bad | 1st metal/Substrate |
|  | 18 | good | | 6.5 | | bad | | 62.93 | 62.16 | bad | bad | 1st metal/Substrate |
|  | 19 | good | | 6.6 | | bad | | 65.12 | 68.16 | bad | bad | 1st metal/Substrate |
|  | 20 | good | | 6.7 | | bad | | 61.63 | 63.27 | bad | bad | 1st metal/Substrate |
|  | 21 | good | | 6.4 | | bad | | 67.28 | 63.42 | bad | bad | 1st metal/Substrate |
|  | 22 | good | | 8.5 | | good | | 67.33 | 67.58 | bad | bad | 1st metal/Substrate |
|  | 23 | good | | 9.5 | | good | | 64.91 | 65.27 | bad | bad | 1st metal/Substrate |
|  | 24 | good | | 8.7 | | good | | 61.48 | 67.69 | bad | bad | 1st metal/Substrate |
|  | 25 | good | | 9.3 | | good | | 61.71 | 63.19 | bad | bad | 1st metal/Substrate |
|  | 26 | good | | 9.3 | | good | | 61.23 | 62.22 | bad | bad | 1st metal/Substrate |
|  | 27 | good | | 9.5 | | good | | 66.73 | 65.07 | bad | bad | 1st metal/Substrate |
|  | 28 | good | | 14.7 | | good | | 66.47 | 63.94 | bad | bad | 1st metal/Substrate |
|  | 29 | good | | 13.1 | | good | | 61.50 | 62.52 | bad | bad | 1st metal/Substrate |
|  | 30 | good | | 13.4 | | good | | 64.37 | 68.89 | bad | bad | 1st metal/Substrate |
|  | 31 | good | | 13.8 | | good | | 63.37 | 68.84 | bad | bad | 1st metal/Substrate |
|  | 32 | good | | 14.0 | | good | | 65.73 | 62.65 | bad | bad | 1st metal/Substrate |
|  | 33 | good | | 13.7 | | good | | 64.96 | 67.58 | bad | bad | 1st metal/Substrate |
|  | 34 | good | | 13.3 | | good | | 68.54 | 67.20 | bad | bad | 1st metal/Substrate |
|  | 35 | good | good | 5.0 | | good | good | | 39.16 | bad | bad | 1st metal/2nd metal/Substrate |
|  | 36 | good | good | 5.8 | | good | good | | 30.88 | bad | bad | 1st metal/2nd metal/Substrate |
|  | 37 | good | good | 5.1 | | good | good | | 28.14 | bad | bad | 1st metal/2nd metal/Substrate |
|  | 38 | good | good | 5.8 | | good | good | | 41.55 | bad | bad | 1st metal/2nd metal/Substrate |
|  | 39 | good | good | 5.8 | | good | good | | 34.11 | bad | bad | 1st metal/2nd metal/Substrate |
|  | 40 | good | good | 5.1 | | good | good | | 32.13 | bad | bad | 1st metal/2nd metal/Substrate |
|  | 41 | good | good | 5.3 | | good | good | | 26.91 | bad | bad | 1st metal/2nd metal/Substrate |
|  | 42 | good | good | 5.2 | | good | good | | 26.36 | bad | bad | 1st metal/2nd metal/Substrate |
|  | 43 | good | good | 5.6 | | good | good | | 29.67 | bad | bad | 1st metal/2nd metal/Substrate |
|  | 44 | good | good | 5.3 | | good | good | | 28.14 | bad | bad | 1st metal/2nd metal/Substrate |
|  | 45 | good | good | 5.8 | | good | good | | 65.00 | bad | bad | 1st metal/2nd metal/Substrate |
|  | 46 | good | good | 5.6 | | good | good | | 41.96 | bad | bad | 1st metal/2nd metal/Substrate |
|  | 47 | good | good | 5.2 | | good | good | | 27.11 | bad | bad | 1st metal/2nd metal/Substrate |
|  | 48 | good | good | 5.5 | | good | good | | 63.13 | bad | bad | 1st metal/2nd metal/Substrate |
|  | 49 | good | good | 5.4 | | good | good | | 37.74 | bad | bad | 1st metal/2nd metal/Substrate |
|  | 50 | good | good | 5.8 | | good | good | | 25.61 | bad | bad | 1st metal/2nd metal/Substrate |
|  | 51 | good | good | 5.6 | | good | good | | 43.52 | bad | bad | 1st metal/2nd metal/Substrate |
|  | 52 | good | good | 5.4 | | good | good | | 30.09 | bad | bad | 1st metal/2nd metal/Substrate |
|  | 53 | good | good | 5.4 | | good | good | | 38.49 | bad | bad | 1st metal/2nd metal/Substrate |
|  | 54 | good | good | 5.1 | | good | good | | 26.36 | bad | bad | 1st metal/2nd metal/Substrate |

[Reflectance and Visibility]

As can be seen from the results shown in Table 2, Comparative Examples 1 to 34 did not have the second metal film (second metal layer) and thus, the values of reflectance exceeded 20% at any of the metal film side and the substrate side, so that visibility was poor.

On the other hand, as for Examples 1 to 110 in which the second metal film was formed, the reflectance on the substrate side was suppressed as low as 20% or less in the cases where the second metal film was formed between the first metal film and the substrate, and also in the case where the second metal film was formed on the upper surface of the first metal film, i.e., on the surface opposite to the substrate, the reflectance on the metal film side was satisfactory as 20% or less, so that the effect of forming the second metal film was obtained.

Particularly, in Examples 26, 52, 60, and 68 in which the second metal film was formed both on the upper surface of the first metal film (the surface opposite to the substrate) and between the first metal film and the substrate, the reflectance at the time of viewing from the substrate side and the reflectance at the time of viewing from the metal film side were both 20% or less and thus light reflection was suppressed in two directions which are opposite to each other.

Also in Comparative Examples 35 to 54, the second metal film was formed between the first metal film and the substrate but the reflectance was high as exceeding 20% on the substrate side.

Of these, in Comparative Examples 41 to 44, since the second metal film did not contain Zn, the reflectance became large on the substrate side. On the other hand, in Comparative Examples 35 and 38, since 25% or more of Zn was contained in the second metal film, the reflectance became large on the substrate side.

From these results, the addition of Zn affords an effect of reducing reflectance owing to the oxidation or nitridation of the added element Zn and thus is effective for suppressing the reflectance of the second metal film but it is realized that an excessive addition of 25 at % or more brings about a contrary effect.

Therefore, the content of Zn in the second metal film is desirably from 0.1 at % to less than 25 at %.

Since 15 at % or more of Al was contained in Comparative Examples 36 and 39 and 15 at % or more of Ti was contained in Comparative Examples 37 and 40, the reflectance became large on the substrate side in each case.

From these results, even when Al or Ti is contained in addition to Zn, the reflectance gets worse with exceeding a predetermined value in the case where the addition amount is 15 at % or more.

Therefore, in the case where the second metal film contains Al, Ti, Sn, and/or Ni together with Zn, the total content of the Al, Ti, Sn, and Ni elements is desirably controlled to from 0.1 at % to less than 15 at %.

Moreover, as in Comparative Examples 45 to 54, the reflectance exceeded 20% on the substrate side also in the case where the content of O in the second metal film was 20 at % or less or in the case where that of N was 10 at % or less.

From these results, in order to suppress the reflectance as low, it is desired to contain 30 at % or more of O or 15 at % or more of N in the second metal film.

[Electric Resistivity]

In Examples 1 to 110 in which a Cu alloy containing Cu, Zn and at least one element (M element) selected from the group consisting of B, Mg, Al, Ca, Ti, and Cr was used as the first metal film, since 0.1 at % to 6 at % of the M element was contained and 0.1 at % to 10 at % of Zn was contained, the electric resistivity was low as 8.0 μΩ·cm or less in all of these Examples, so that sufficient performance as an electrode was exhibited in any case.

On the other hand, regarding Comparative Examples, the electric resistivity was satisfactory as 8.0 μΩ·cm or less in Comparative Example 3 but the electric resistivity was high as exceeding 8.0 μΩ·cm in Comparative Examples 4 to 9 and Comparative Examples 22 to 34, and thus resistance values were high in these cases.

From these results, it is realized that the case where Cu is alloyed with Zn alone is good but the electric resistivity gets worse beyond a predetermined value in the case where Cu is alloyed with the M element alone without alloying with Zn, the electric resistivity also gets worse beyond a predetermined value when the content of the M element is excessive beyond 6 at % even in the case where the M element is contained as an alloy metal together with Zn, and the electric resistivity similarly also gets worse beyond a predetermined value when the amount of Zn added is excessive beyond 10 at % even in the case where Zn is contained together with the M element.

Therefore, in the case where a Cu alloy is used as the first metal film, it is desired that both of the M element and Zn element are contained as alloy elements and furthermore the M element is contained in a content of from 0.1 at % to 6 at % and Zn is contained in a content of from 1 at % to 10 at %.

[Adhesiveness]

Adhesiveness was judged as good when the evaluated degree of adhesion is classified as a classification 0 to 3 as defined in JIS K5600-5-6:1999 and judged as poor when it falls outside of the classification 0 to 3.

In Comparative Examples 3 to 9, the first metal film was constituted by a Cu alloy but, since the composition did not contain both elements of the M element such as B, Mg, Al, Ca, Ti, or Cr and Zn simultaneously, the adhesiveness was poor.

In Comparative Examples 16 to 21, the first metal film was constituted by a Cu alloy and the composition contained both elements of the M element such as B, Mg, Al, Ca, Ti, or Cr and Zn simultaneously but, since the total content of the M element of B, Mg, Al, Ca, Ti, and Cr was less than 0.1 at %, the adhesiveness was poor.

On the other hand, in Examples 1 to 110, both of the first metal film and the second metal film exhibited good adhesiveness.

The embodiments and Examples of the present invention are described in detail in the above but they are only examples and the present invention can be practiced in variously changed manners in the range where they do not depart from the gist thereof.

The present application is based on the Japanese patent application No. 2014-217771 filed on Oct. 24, 2014, and the contents thereof are incorporated herein by reference.

DESCRIPTION OF REFERENCE NUMERALS AND SIGNS 10, 10A, 20, 20A, 22, 22A, 24, 24A, 26, 28, 30, 32, 34, 36: Laminated body
12: Substrate
14, 14-1, 14-2: First metal layer
14D, 14-1D, 14-2D: Electrode
16: Second metal layer

What is claimed is:

1. A laminated body comprising at least:
   (a) a transparent substrate,
   (b) a first metal layer that is overlaid on the substrate and forms an electrode, and
   (c) a second metal layer having a light reflectance of 20% or less, wherein the second metal layer is overlaid on the surface of the first metal layer opposite to the substrate or between the first metal layer and the substrate by sputtering using a reactive sputtering gas, wherein the second metal layer is constituted by an oxide or nitride of a Cu alloy comprising at least Zn.

2. The laminated body according to claim 1, wherein the second metal layer is overlaid both on the surface of the first metal layer opposite to the substrate and between the first metal layer and the substrate so as to sandwich the first metal layer without interposing the substrate.

3. The laminated body according to claim 1, wherein the first metal layer is constituted by a Cu alloy, and the Cu alloy has a composition comprising Zn and at least one element selected from the group consisting of B, Mg, Al, Ca, Ti, and Cr, with the balance being Cu and inevitable impurities.

4. The laminated body according to claim 3, wherein the Cu alloy constituting the first metal layer has a composition comprising Zn in a content of from 0.1 at % to 10 at % and comprising the at least one element selected from the group consisting of B, Mg, Al, Ca, Ti, and Cr in a total content of from 0.1 at % to 6 at %, with the balance being Cu and inevitable impurities.

5. The laminated body according to claim 1, wherein the first metal layer has an electric resistivity of 8.0 μΩ·cm or less.

6. The laminated body according to claim 1, wherein the first metal layer is in close contact with the transparent substrate or/and the second metal layer, and a degree of adhesion therebetween is classified as a classification 0 to 3 as defined in JIS K5600-5-6:1999.

7. The laminated body according to claim 1, wherein the second metal layer is formed by sputtering using a target material, and the target material is composed of a Cu alloy having a composition comprising Zn with the balance being Cu and inevitable impurities, or a Cu alloy having a composition comprising Zn and at least one element selected from the group consisting of Al, Ti, Sn, and Ni, with the balance being Cu and inevitable impurities.

8. The laminated body according to claim 1, wherein the second metal layer has a composition comprising Zn in a content of from 0.1 at % to less than 25 at %, with the balance being Cu, and O or N, and inevitable impurities.

9. The laminated body according to claim 1, wherein the second metal layer has a composition comprising Zn in a content of from 0.1 at % to less than 25 at % and at least one element selected from the group consisting of Al, Ti, Sn, and Ni in a total content of from 0.1 at % to less than 15 at %, with the balance being Cu, and O or N, and inevitable impurities.

10. The laminated body according to claim 7, wherein the second metal layer is in close contact with the transparent substrate or/and the first metal layer, and a degree of adhesion therebetween is classified as a classification 0 to 3 as defined in JIS K5600-5-6:1999.

* * * * *